US010986757B2

(12) United States Patent
Saturley et al.

(10) Patent No.: US 10,986,757 B2
(45) Date of Patent: Apr. 20, 2021

(54) HARDENED OPTICAL PLATFORM WITH PLUGGABLE OPTICS

(71) Applicant: Ciena Corporation, Hanover, MD (US)

(72) Inventors: Peter Saturley, Ottawa (CA); Terence Graham, Manotick (CA)

(73) Assignee: Ciena Corporation, Hanover, MD (US)

( * ) Notice: Subject to any disclaimer, the term of this patent is extended or adjusted under 35 U.S.C. 154(b) by 289 days.

(21) Appl. No.: 16/137,123

(22) Filed: Sep. 20, 2018

(65) Prior Publication Data

US 2020/0100386 A1     Mar. 26, 2020

(51) Int. Cl.
*G02B 6/44* (2006.01)
*H05K 7/20* (2006.01)
*H05K 7/10* (2006.01)
*H05K 5/00* (2006.01)
*H05K 7/02* (2006.01)

(52) U.S. Cl.
CPC .......... *H05K 7/2049* (2013.01); *G02B 6/445* (2013.01); *H05K 5/0069* (2013.01); *H05K 7/026* (2013.01); *H05K 7/10* (2013.01); *H05K 7/20336* (2013.01); *H05K 7/20418* (2013.01)

(58) Field of Classification Search
CPC .............................. G02B 6/445; H05K 7/2049
See application file for complete search history.

(56) References Cited

U.S. PATENT DOCUMENTS

| 9,021,130 B1* | 4/2015 | Sahay | H04L 49/60 |
| | | | 709/239 |
| 2006/0093285 A1* | 5/2006 | Park | G02B 6/4292 |
| | | | 385/92 |
| 2012/0236598 A1* | 9/2012 | Germain | C07D 401/12 |
| | | | 362/612 |
| 2017/0150645 A1* | 5/2017 | Huang | G02B 6/4278 |
| 2017/0269314 A1 | 9/2017 | Gaal | |

* cited by examiner

*Primary Examiner* — Sung H Pak
*Assistant Examiner* — Hoang Q Tran
(74) *Attorney, Agent, or Firm* — Clements Bernard Walker; Lawrence A. Baratta, Jr.; Christopher L. Bernard

(57) ABSTRACT

A module in a hardened optical platform includes one or more Printed Circuit Boards (PCB) and associated components; at least one cage configured to receive a pluggable optical module, wherein the at least one cage is on a PCB of the one or more PCBs; and a housing enclosing the one or more PCBs, wherein the housing covers the one or more PCBs, the associated components, and the at least one cage with the pluggable optical module, with respect to airflow, wherein a thermally conductive conduit is formed between the pluggable optical module once inserted and the housing, enabling the pluggable optical module to operate in the housing which is sealed with respect to airflow.

20 Claims, 20 Drawing Sheets

US 10,986,757 B2

HARDENED OPTICAL PLATFORM WITH PLUGGABLE OPTICS

FIELD OF THE DISCLOSURE

The present disclosure generally relates to networking equipment. More particularly, the present disclosure relates to a hardened optical platform with pluggable optics.

BACKGROUND OF THE DISCLOSURE

An insatiable appetite for network resources, the growing number of Internet connections, ever-faster media streaming devices and the escalation of high-definition mobile video are together burdening already overtaxed cable networks. In the cable world, these applications require huge amounts of bandwidth coupled with low latency. What's more, the supporting infrastructure must offer the flexibility to cope with steadily increasing dynamic traffic flows. Accordingly, most cable operators are looking to a "Fiber Deep" architecture, which is an end-to-end solution combining packet switching and aggregation alongside coherent optical technology. In this case, Hybrid Fiber Coax (HFC) architectures are transformed and coexist with modern digital fiber and packet technologies. The term "Fiber Deep" has been used to describe an approach that empowers a forward-looking, universal access framework that includes Data Over Cable Service Interface Specification (DOC SIS), Remote PHY devices (RPD), point-to-point 10G, and higher fiber-based business services, variants of Passive Optical Network (xPON), small cells and finally Converged Haul 4G and 5G New Radio (NR) mobility futures.

As well, thermal management for high-speed optical networking equipment is a challenge. In a controlled environment, thermal management is achieved through air flow, vents in a chassis, fans, design choices, etc. For example, some work has focused on managing air flow to enable back-to-back shelf configurations, i.e., front or side airflow only, which is advantageous in Central Offices (CO), data centers, etc. However, these deployments are all in a controlled environment, e.g., air conditioning, no exposure to the environment, etc.

The use of pluggable optical modules is common in high-speed optical networking equipment deployed in a controlled environment. Numerous techniques for cooling pluggable optical modules exist, but they require the system to be in a forced air flow driven by cooling fans. For outside plant equipment that is deployed in sealed housings (i.e., hardened), there is no air flow around the module and heat must be conducted to the housing by means of a heat sink, heat pipe, or vapor chamber. Attachment and alignment of a heat sink or similar device is made difficult by the lack of access to the pluggable optic cage.

BRIEF SUMMARY OF THE DISCLOSURE

In an embodiment, a module in a hardened optical platform includes one or more Printed Circuit Boards (PCB) and associated components; at least one cage configured to receive a pluggable optical module, wherein the at least one cage on a PCB of the one or more PCBs; and a housing enclosing the one or more PCBs, wherein the housing covers the one or more PCBs, the associated components, and the at least one cage with the pluggable optical module, with respect to airflow, wherein a thermally conductive conduit is formed between the pluggable optical module once inserted and the housing, enabling the pluggable optical module to operate in the housing which is sealed with respect to airflow. The thermally conductive conduit can be a heat sink which is configured to make uniform thermal contact with the pluggable optical module once inserted and the heat sink extends to the housing. The thermally conductive conduit can be formed by copper or aluminum which is routed from the cage to the housing. Heat moves along the thermally conductive conduit to the housing and from the housing to a thermal contact surface on an enclosure of the hardened optical platform.

The thermally conductive conduit can include a first substantially flat portion which makes thermal contact with the pluggable optical module, a second portion connected to the first substantially flat portion at a first end, and a third portion connected to the first substantially flat portion at a second end opposite from the first end. The third portion can extend to attach to the housing. A spring can apply a force to the second portion to ensure uniform contact between the first substantially flat portion and the pluggable optical module once inserted. A cam can apply a force to the second portion to ensure uniform contact between the first substantially flat portion and the pluggable optical module once inserted. The pluggable optical module once inserted can be locked in place when the cam is engaged.

In a further embodiment, a hardened optical platform includes a plurality of modules housed in a hardened enclosure which is environmentally sealed; a first module of the plurality of modules including: one or more Printed Circuit Boards (PCB) and associated components; at least one cage configured to receive a pluggable optical module, wherein the at least one cage is on a PCB of the one or more PCBs; and a housing enclosing the one or more PCBs, wherein the housing covers the one or more PCBs, the associated components, and the at least one cage with the pluggable optical module, with respect to airflow, wherein a thermally conductive conduit is formed between the pluggable optical module once inserted and the housing and from the housing to the hardened enclosure, enabling the pluggable optical module to operate in the hardened enclosure which is sealed with respect to airflow. The thermally conductive conduit can be a heat sink which is configured to make uniform thermal contact with the pluggable optical module once inserted and the heat sink extends to the housing. The thermally conductive conduit can be formed by copper or aluminum which is routed from the cage to the housing to the hardened enclosure. Heat moves along the thermally conductive conduit to the housing and from the housing to a thermal contact surface on an enclosure of the hardened optical platform.

The thermally conductive conduit can include a first substantially flat portion which makes thermal contact with the pluggable optical module, a second portion connected to the first substantially flat portion at a first end, and a third portion connected to the first substantially flat portion at a second end opposite from the first end. The third portion can extend to attach to the housing. A spring or cam can apply a force to the second portion to ensure uniform contact between the first substantially flat portion and the pluggable optical module once inserted. The plurality of modules can include a line module, a client module, and a switch module. The hardened enclosure can include a plurality of heat fins which are thermally disposed to the thermally conductive path for radiating heat external to the hardened enclosure.

In a further embodiment, a method includes providing a module configured to operate in a hardened optical platform, wherein the module includes: one or more Printed Circuit Boards (PCB) and associated components; at least one cage configured to receive a pluggable optical module, wherein the at least one cage is on a PCB of the one or more PCBs; and a housing enclosing the one or more PCBs, wherein the housing covers the one or more PCBs, the associated components, and the at least one cage with the pluggable optical module, with respect to airflow, wherein a thermally conductive conduit is formed between the pluggable optical module once inserted and the housing, enabling the pluggable optical module to operate in the housing which is sealed with respect to airflow. The method can further include engaging one of a spring and a cam to cause the thermally conductive conduit to make uniform contact with the pluggable optical module once inserted.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
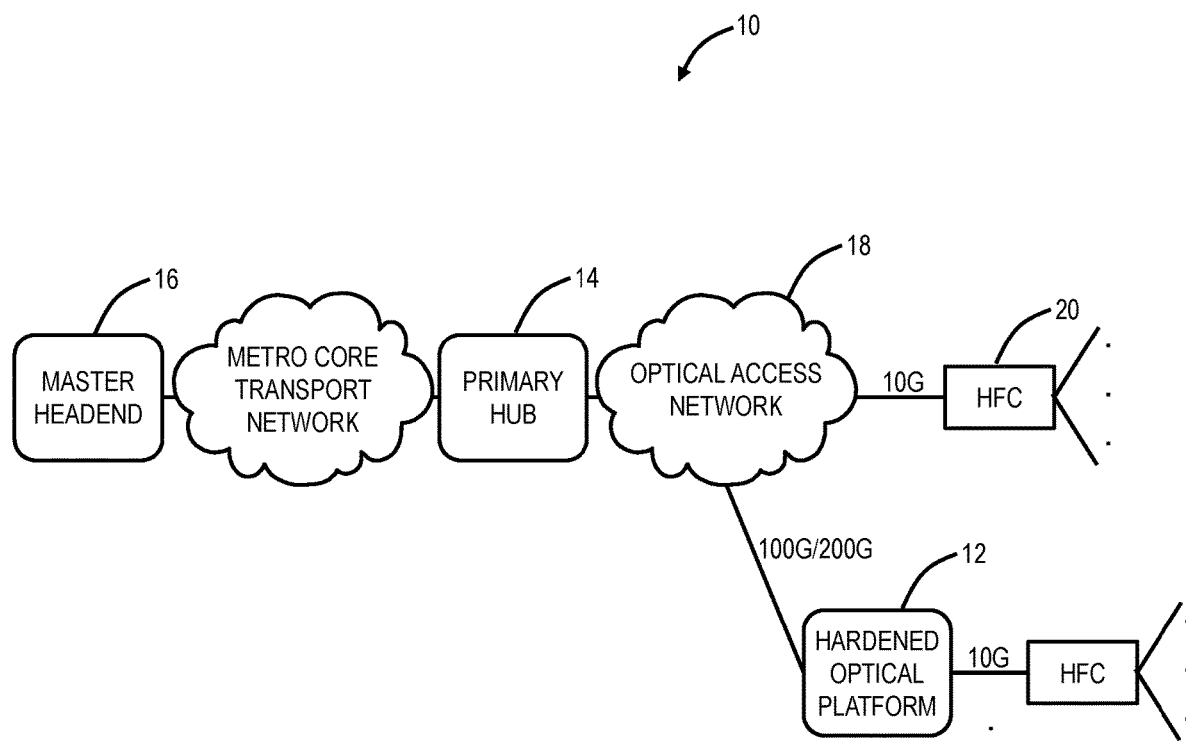
FIG. 1 is a network diagram of a network utilizing a hardened optical platform in a so-called "Fiber Deep" architecture.

In various embodiments, the present disclosure relates to a hardened optical platform with pluggable optics. The hardened optical platform contemplates deployment in an outdoor plant system or the like. By hardened, the hardened optical platform is designed to be placed anywhere in the telecommunications environment, including any climate and any outdoor or indoor mounting. Thus, the hardened optical platform is sealed from harmful ingress, such as water. It is durable from corrosion, even in high-salt environments. Importantly, the hardened optical platform does not have air flow, vents, etc. permitting air exchange with the exterior. However, the hardened optical platform supports pluggable optical modules with a thermally conductive conduit created for heat to flow from the pluggable optical module once inserted to the housing and the outside of an enclosure of the hardened optical platform. In addition, this conduit is created with the ability to install and remove the pluggable optical module from the hardened optical platform and without putting excessive or uncontrolled force on the pluggable optical module. The hardened optical platform accomplishes this by attaching a heat sink or heat pipe to the enclosure and using advantageous placement of springs or cams to align the heat sink with the pluggable optical module.

Coherent Optics

Coherent optical technology uses a Digital Signal Processor (DSP) at both the transmitter and receiver, higher bit-rates, providing greater degrees of flexibility, simpler photonic line systems, and better optical performance. Fiber types and fiber impairments can be compensated for, leading to fewer regenerators and amplifiers, lowering costs, increasing transmission distances and adding traffic-handling capacity. Coherent optics can be implemented in either an integrated or pluggable optical module form factors. In the integrated approach, vendors customize solutions with their own technology and benefits. Pluggable coherent technologies can be split into two basic types: Analog Coherent Optics (ACO) and Digital Coherent Optics (DCO). ACOs consume less power by removing DSP functionality (and its hardware) from the pluggable optical module. The pluggable optical module communicates with the carrier circuit board using analog signals via a special connector and is where the DSP functionality resides. DCOs have the DSP function embedded within the pluggable optical module. This approach makes them more compatible with other vendors but consumes more power and has less vendor-specific technology.

For its part, coherent packet-optical combines the power of coherent optical transmission technology with packet fabric-based switching. It simplifies the network design and operations by eliminating the cost and complexity associated with deploying separate and physically distinct packet and optical platforms. It also facilitates future Distributed Access Architecture (DAA) and legacy Converged Cable Access Platform (CCAP) support.

"Fiber Deep"

FIG. 1 is a network diagram of a network 10 utilizing a hardened optical platform 12 in a so-called "Fiber Deep" architecture. Generally, the "Fiber Deep" architecture relates to including coherent optics closer to end users, including in outside plant configurations requiring the hardened optical platform 12. That is, the "Fiber Deep" architecture includes movement of fiber ever closer to customers requiring placement of the hardened optical platform 12 in non-controlled environments, i.e., outdoors.

The hardened optical platform 12 enables the use of pluggable optical modules (include ACO, DCO, and the like) in an outside plant deployment, such as the "Fiber Deep" architecture. Using the hardened optical platform 12, cable operators or the like can offer flexibility to boost fiber capacity to deliver more bandwidth and scalability between a hub 14 and headend 16 locations, and an optical access network 18 right to the network edge. Specifically, the optical access network 18 can connect directly to Hybrid Fiber Coax (HFC) devices 20, or through the hardened optical platform 12 to extend the fiber bandwidth such as support 100G/200G or more in the optical access network 18. In practical implementations, networking gear is targeted at one of two environments—commercial or industrial. Commercial environments are typically controlled, while industrial environments are referred to as "temperature hardened" or outdoor. Cable operators operate in both environments, using both outdoor cabinet and pole applications.

In an embodiment, the hardened optical platform 12 can be pole/strand-mounted and it can be a network element supporting modular packet and Optical Transport Networking (OTN) switching in the network 10. For example, the hardened optical platform 12 can support 24×10G client ports (facing the HFC, for example) and 2×100G/200G line ports (facing the optical access network 18).

Those skilled in the art will recognize the network 10 is presented for illustration purposes as one possible application for the hardened optical platform 12 described herein. Other embodiments are also contemplated. The objective of the hardened optical platform 12 is to provide a hardened platform that supports pluggable optical modules including coherent optics such as ACO, DCO, etc. such that these pluggable optical modules can be deployed outside of controlled environments.

Hardened Optical Platform

Figure 2:
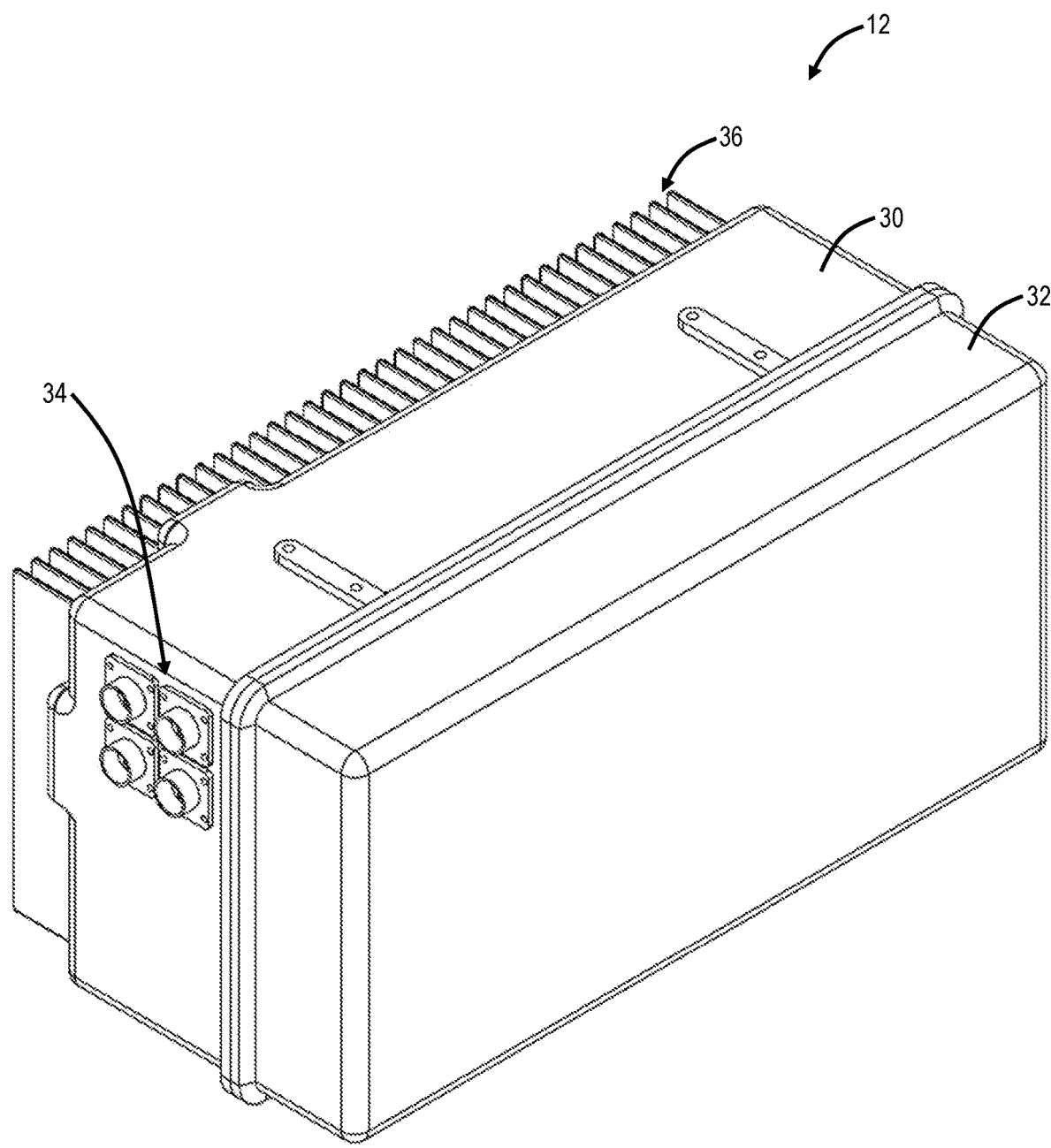
FIG. 2 is a perspective diagram of the enclosure of the hardened optical platform with a door closed.
Figure 3:
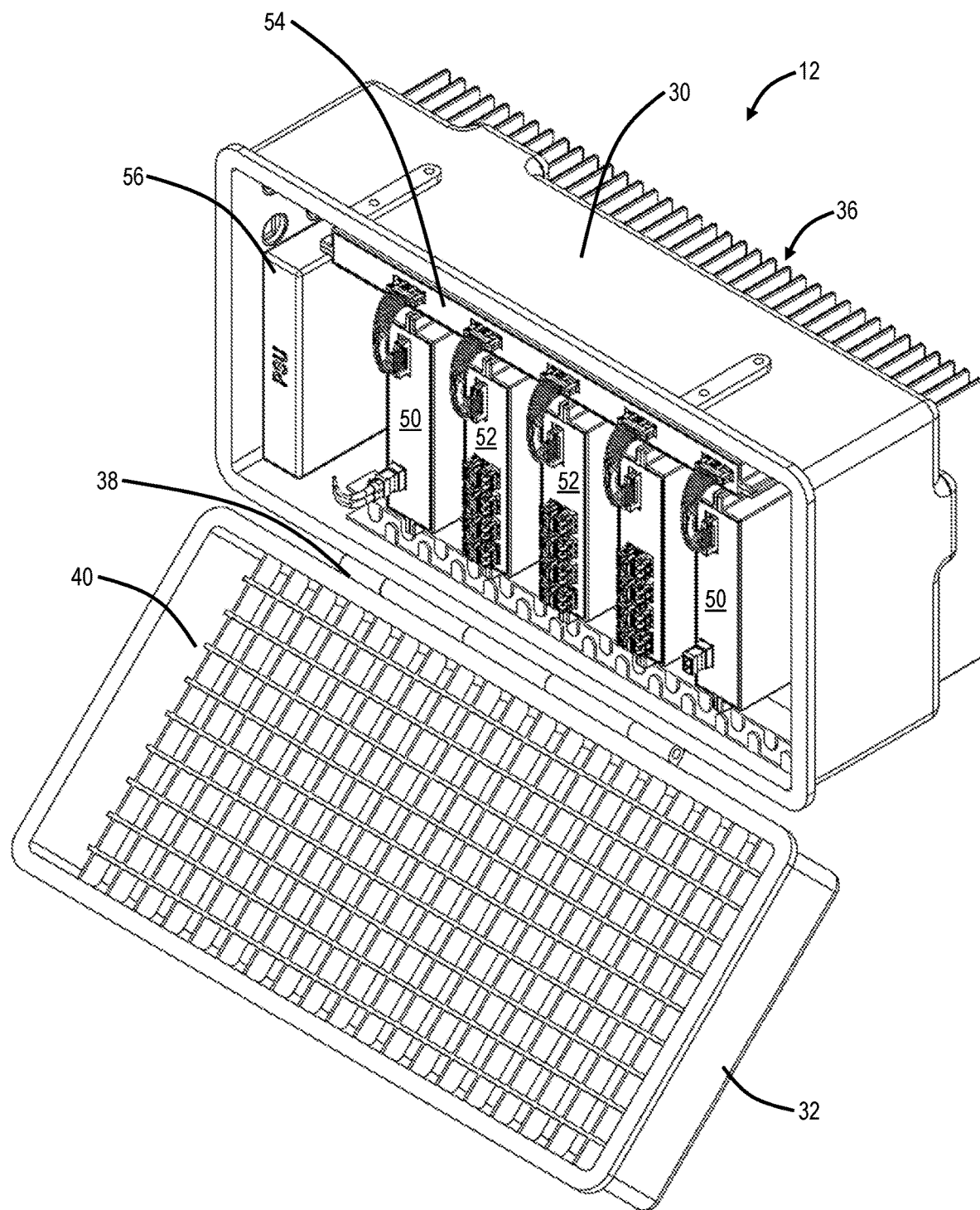
FIG. 3 is a perspective diagram of the enclosure of the hardened optical platform with the door open.
Figure 4:
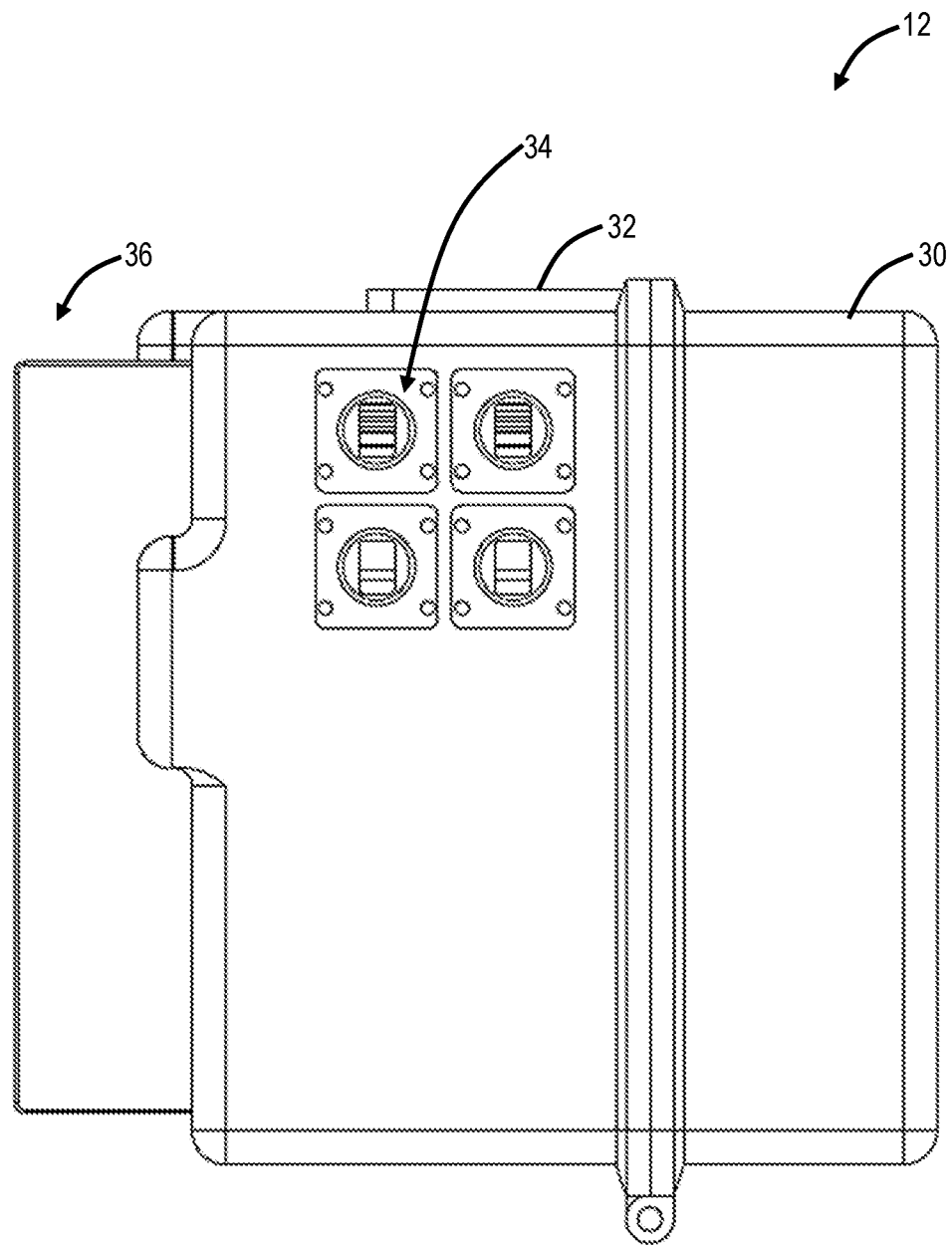
FIG. 4 is a side view diagram of the enclosure of the hardened optical platform illustrating fiber and power access ports in the enclosure.
Figure 5:
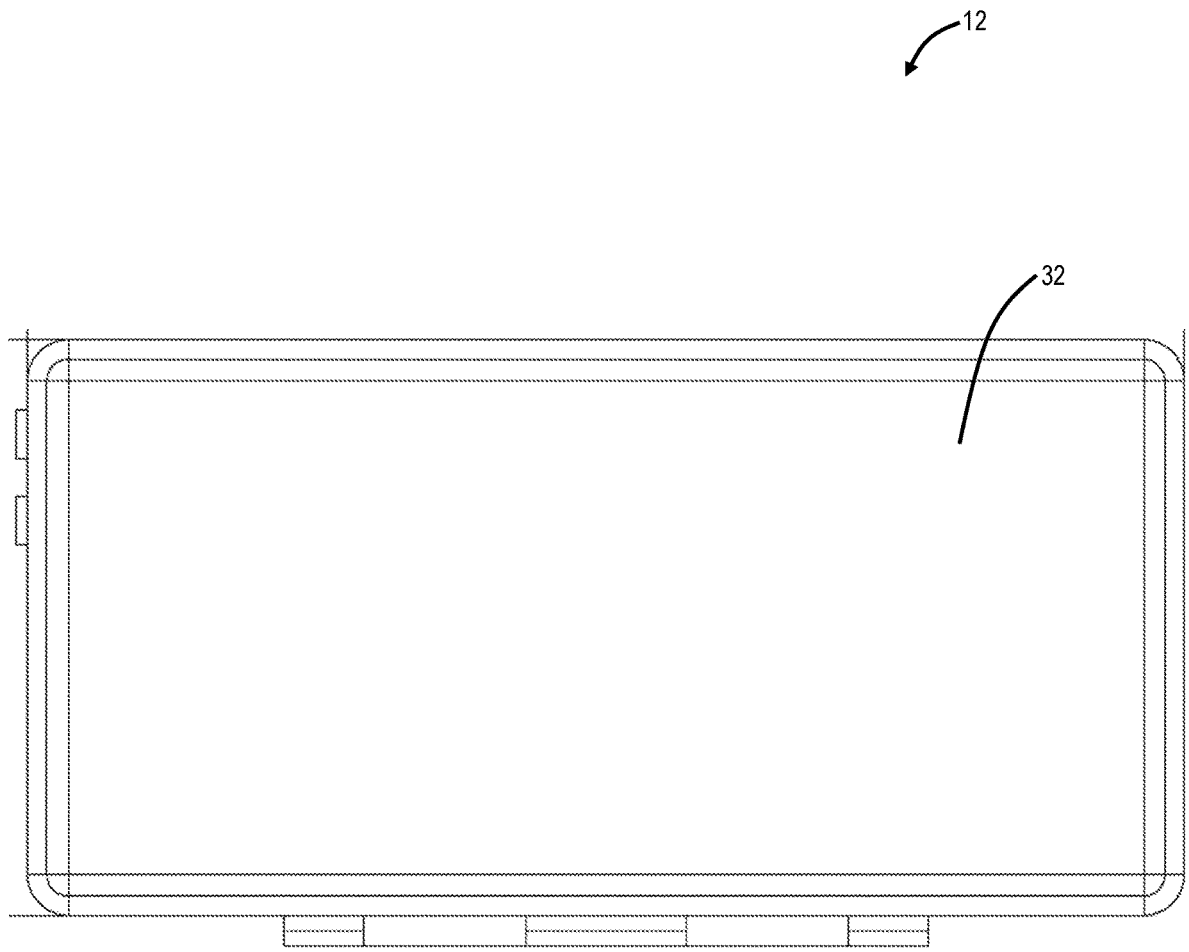
FIG. 5 is a front view diagram of the door of the hardened optical platform.
Figure 6:
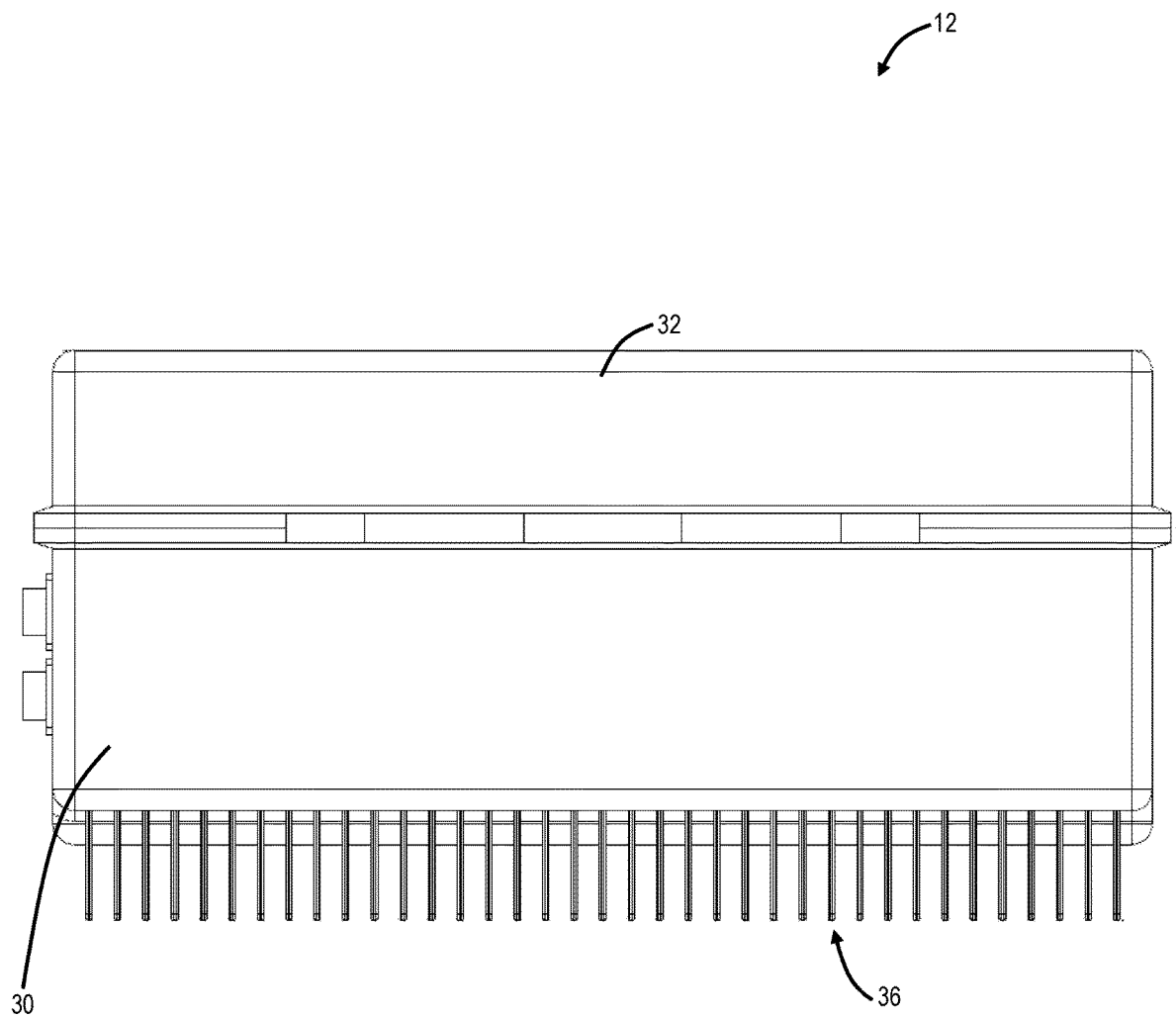
FIG. 6 is a top view diagram of the enclosure of the hardened optical platform with the door closed.
Figure 7:
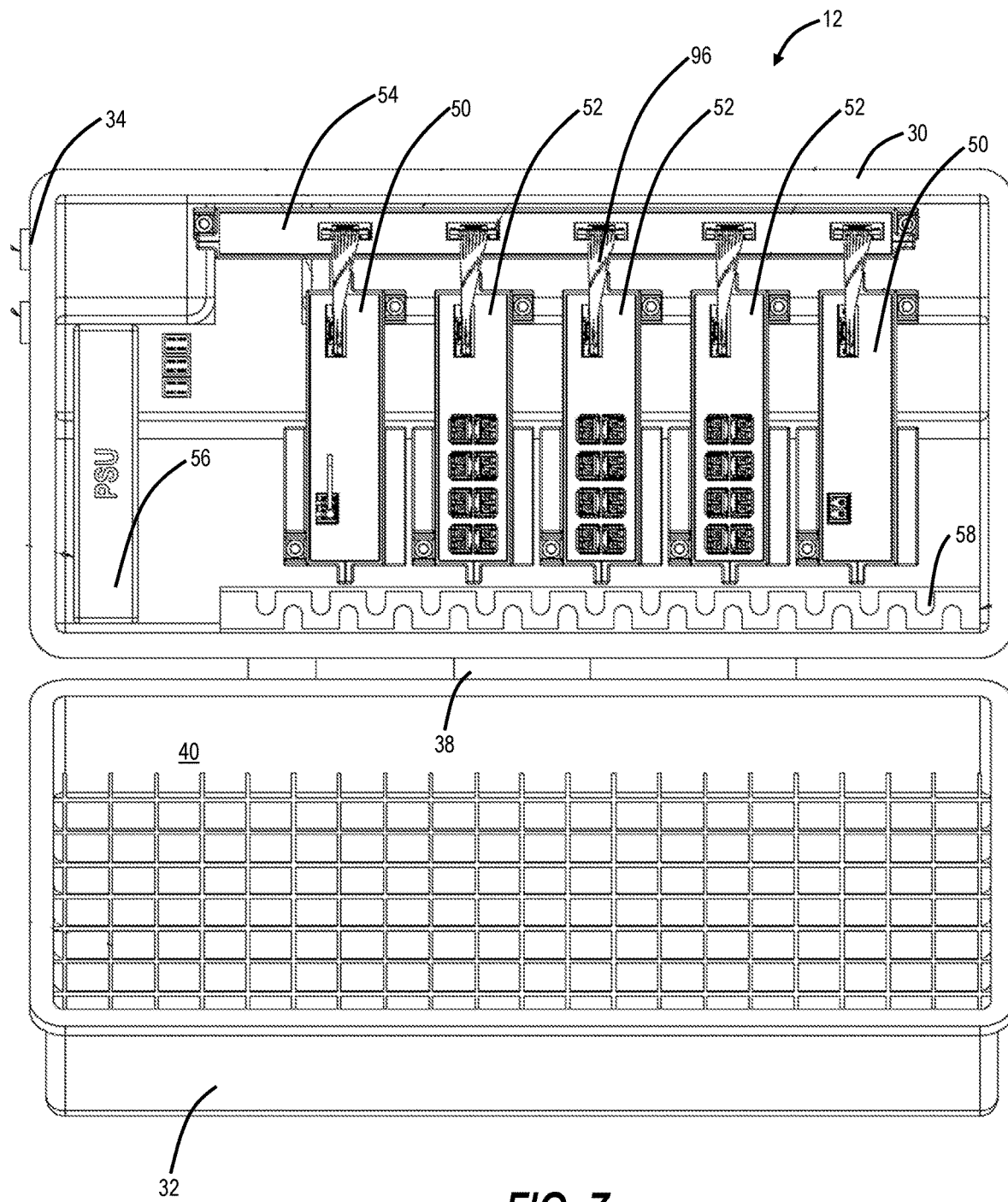
FIG. 7 is a front view diagram of the hardened optical platform with the door open.

FIGS. 2-7 are diagrams of an enclosure 30 of the hardened optical platform 12. Specifically, FIG. 2 is a perspective diagram of the enclosure 30 of the hardened optical platform 12 with a door 32 closed, FIG. 3 is a perspective diagram of the enclosure 30 of the hardened optical platform 12 with the door 32 open, FIG. 4 is a side view diagram of the enclosure 30 of the hardened optical platform 12 illustrating fiber and power access ports 34 in the enclosure 30, FIG. 5 is a front view diagram of the door 32 of the hardened optical platform 12, FIG. 6 is a top view diagram of the enclosure 30 of the hardened optical platform 12 with the door 32 closed, and FIG. 7 is a front view diagram of the hardened optical platform 12 with the door 32 open.

The hardened optical platform 12 includes the enclosure 30 and the door 32 which can be any hardened material, i.e., which is environmentally sealed to water, wind, etc. Specifically, the hardened optical platform 12, via the enclosure 30 and the door 32, is weatherproof. The enclosure 30 can include the fiber and power access ports 34 on a side enabling cables to be routed into the interior. In an embodiment, the enclosure 30 is fixed, and the door 32 can rotatably open for interior access. The enclosure 30 can also include heat fins 36 on a rear portion to move heat generated in the interior to the environment via convection. Again, there is no airflow between the interior and the environment.

In an embodiment, the hardened optical platform 12 can be mounted on a pole or the like. In another embodiment, the hardened optical platform 12 can be placed on a pedestal or some other outdoor location. In a further embodiment, the hardened optical platform 12 can be mounted on a building exterior or the like.

In an embodiment, the hardened optical platform 12 can have a rectangular shape. Example dimensions can include 270 mm×540 mm×270 mm (H×W×D). For example, the hardened optical platform 12 can have a similar size/functionality of a 1-2 Rack Unit (RU) mountable system (e.g., a "pizza box").

In FIGS. 3 and 7, the door 32 is shown open. The door 32 can open and rotate downward about a hinge 38 on a front of the enclosure 30. A front cover 40 of the door 32 can include space and guides for fiber management and fiber splicing.

The hardened optical platform 12 can include various modules which can be field replaceable. Again, in FIGS. 3 and 7, the modules can include a line module 50, a client module 52, switch module 54, and a power supply unit (PSU) 56. Of course, other types of modules are contemplated. Also, the hardened optical platform 12 can include a fiber tray 58 located underneath the modules 50, 52 for fiber slack routing and storage.

The hardened optical platform 12 can operate with or without a backplane. In this example, there is both a backplane (FIG. 13) and cable connections between the modules 50, 52 and the switch module 54. Again, other embodiments are also contemplated.

Hardened Optical Platform Modules

Figure 8:
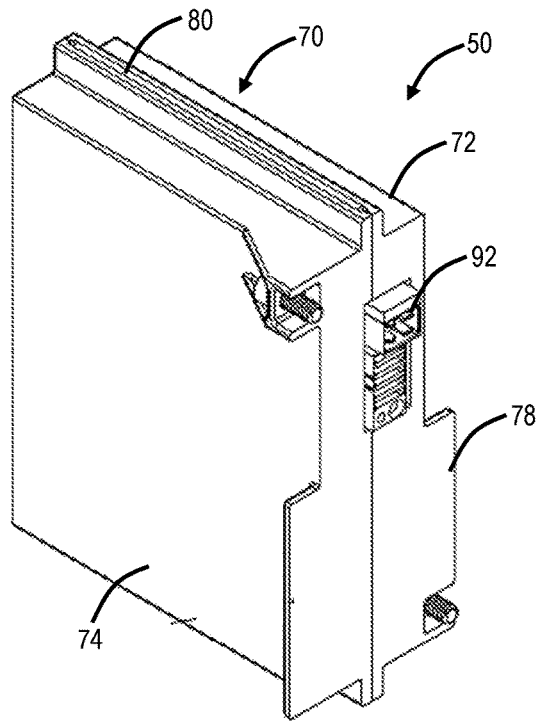
FIG. 8 is a perspective diagram of a front and rear view of a line module for the hardened optical platform.
Figure 8:
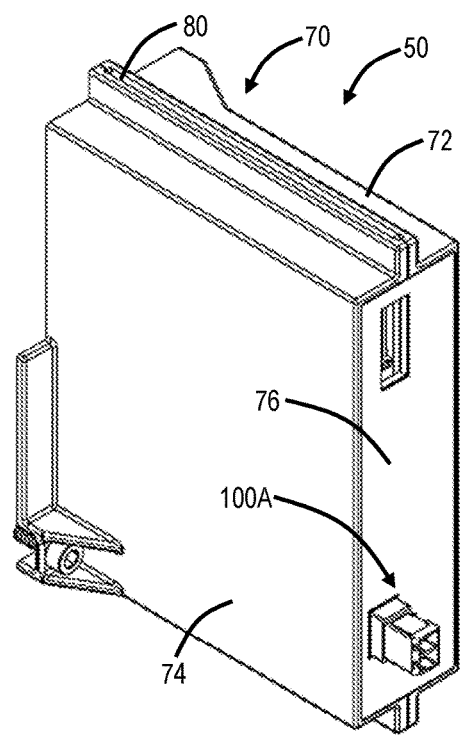
Figure 9:
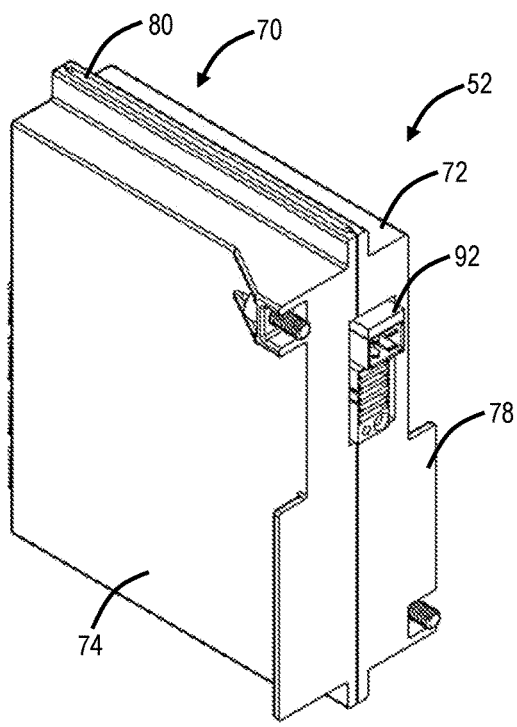
FIG. 9 is a perspective diagram of a front and rear view of a client module for the hardened optical platform.
Figure 9:
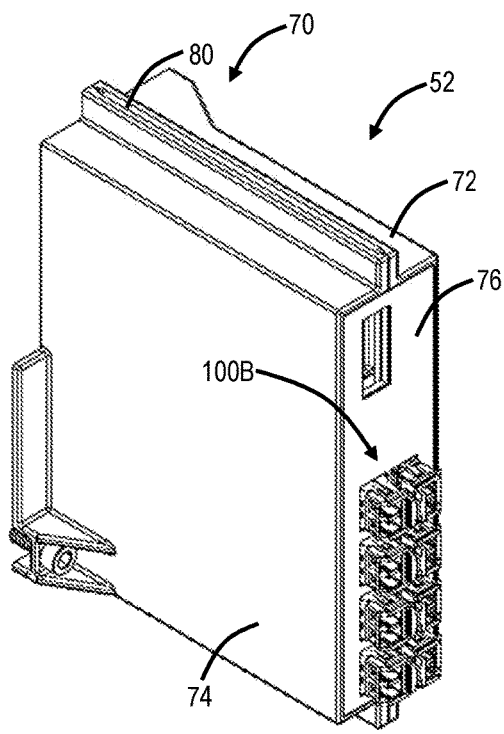
Figure 10:
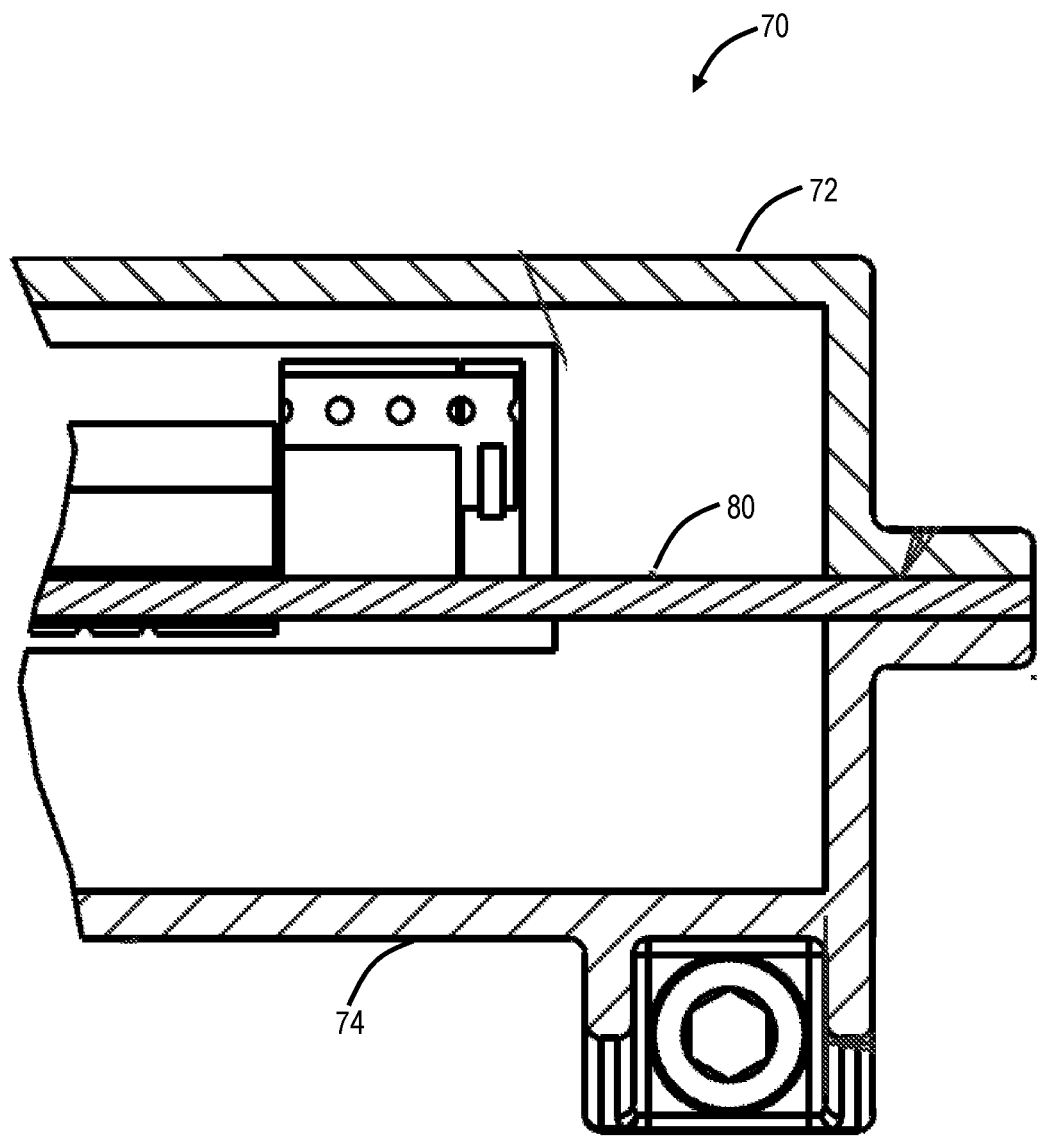
FIG. 10 is a cross-sectional diagram of a housing associated with the line, client, and switch modules in the hardened optical platform.
Figure 11:
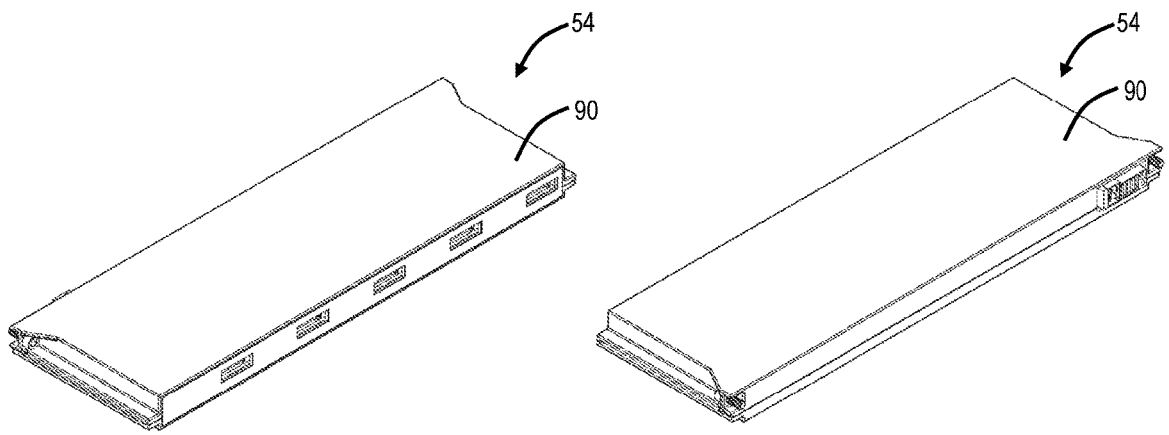
FIG. 11 is a perspective diagram of a front and rear view of the switch module in the hardened optical platform.
Figure 12:
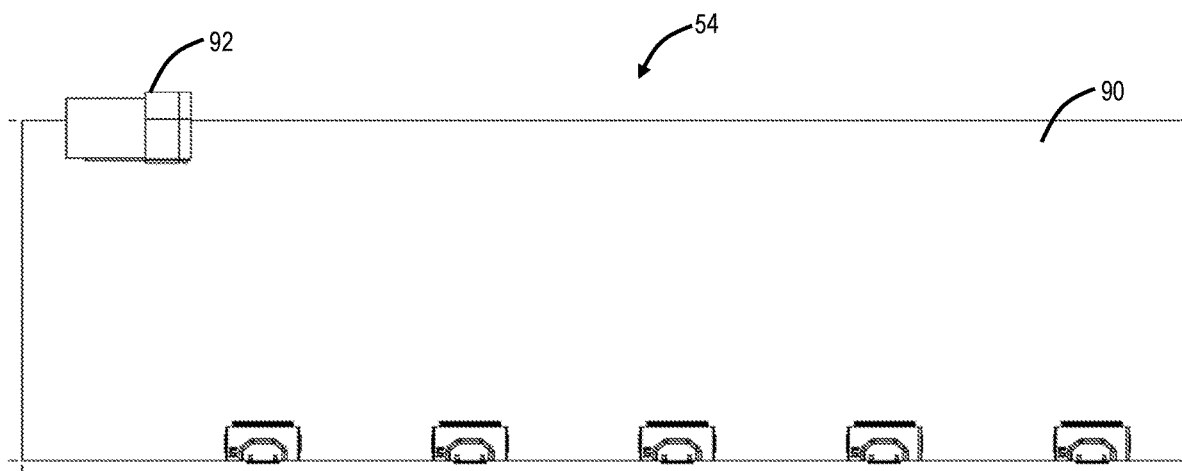
FIG. 12 is a perspective diagram of a top view of the switch module of FIG. 11.
Figure 13:
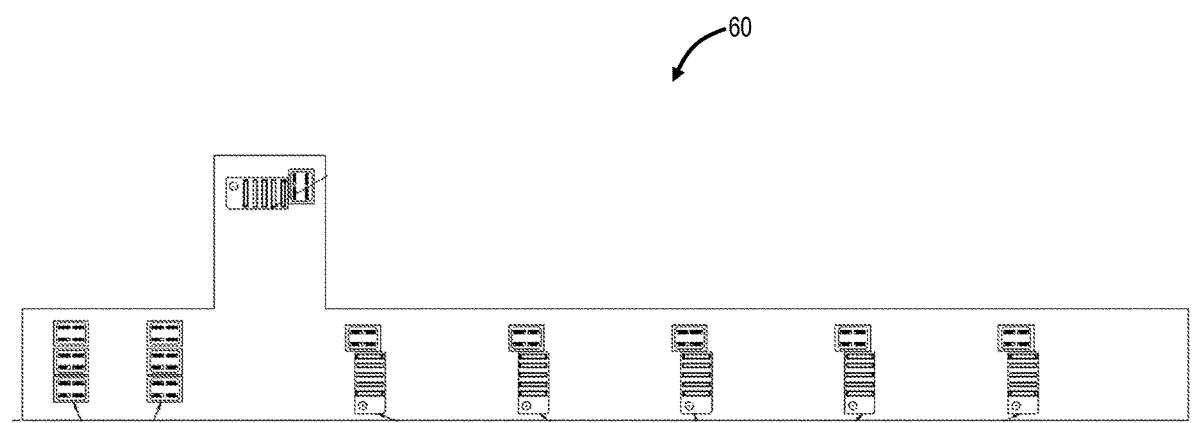
FIG. 13 is a diagram of a front view of a backplane in the hardened optical platform.

FIGS. 8-13 are diagrams of various modules 50, 52, 54 and a backplane 60 associated with the hardened optical platform 12. Specifically, FIG. 8 is a perspective diagram of a front and rear view of the line module 50, FIG. 9 is a perspective diagram of a front and rear view of the client module 52, FIG. 10 is a cross-sectional diagram of a housing 70 associated with the modules 50, 52, 54, FIG. 11 is a perspective diagram of a front and rear view of the switch module 54, FIG. 12 is a perspective diagram of a top view of the switch module 54, and FIG. 13 is a diagram of a front view of the backplane 60 in the hardened optical platform 12.

In this example, these modules can form the functionality of the hardened optical platform 12 in FIG. 1, namely 100G/200G from the optical access network 18 and 10G or the like connections to end users, HFC, etc. In an embodiment, the hardened optical platform 12 can support two line modules 50, such as for working and protection (1+1, ring, mesh, etc.), and three client modules 52 for client interfaces. Again, other embodiments are contemplated. Both the line module 50 and the client module 52 support pluggable optical modules 100 with novel thermal management as described herein.

The line modules 50 each can include a single pluggable optical module 100A. The pluggable optical module 100A can be a coherent pluggable module, such as ACO, DCO, etc. The client modules 52 each can include eight Small Form Factor Pluggable (SFP) pluggable optical modules 100B. For example, assume the SFP pluggable optical modules 100B each operate at 10G, with three client modules 52, the hardened optical platform 12 can have 240G of client interfaces. The pluggable optical module 100A can be 200G+ via coherent optics. The switch module 54 is configured to provide packet switching between the line modules 50 and the client modules 52. Thus, the hardened optical platform 12 can support 200G+ packet switching in an outside plant configuration.

In FIGS. 8 and 9, the modules 50, 52 are fully enclosed modules with the housing 70 having a first side 72, a second side 74, a front faceplate 76, and a rear thermal contact surface 78. Thus, a Printed Circuit Board (PCB) 80 with associated electronics and optics for the modules 50, 52 are fully closed via the housing 70. The housing 70 can be referred to as a clamshell, and the housing 70 can conduct heat from the PCB 80 to the rear thermal contact surface 78. As shown in FIG. 10, the PCB 80 is "sandwiched" between the first side 72 and the second side 74 of the housing 70 for heat removal. The housing 70 is configured to cover various components in the associated module 50, 52, 54.

The rear thermal contact surface 78 can be thermally conductive to the heat fins 36 on the rear portion of the enclosure 30. Thus, the primary means of heat transfer is at the rear of the hardened optical platform 12. The modules 50, 52, 54, 56 can be affixed to the enclosure 30 via a mechanical connection that provides a large contact force and low thermal impedance.

In FIGS. 11 and 12, similar to the modules 50, 52, the switch module 54 also includes a housing 90. The switch module 54 connects to the modules 50, 52 via a connector ribbon on the front side of each of the modules 50, 52, 54. Further, each of the modules 50, 52, 54 include rear-side connectors 92 which connect to the backplane 60 in FIG. 13. For example, the rear-side connectors 92 can provide power and telemetry connections whereas the connector ribbon can provide data connectivity. Again, other embodiments are contemplated.

The switch module 54 is arranged perpendicular to the other modules 50, 52 and runs along the length of the enclosure 30 to facilitate connection to the modules 50, 52. This minimizes the length any signal must travel to the switch module 54. Further, the connections 96 can be a high-speed signal cable to connect the modules, reducing or eliminating the need for the backplane 60. Also, the size of the switch module 54 and the high-speed signal cable pitch can be chosen such that the same cable can be used to interconnect different types of modules.

In FIG. 7, connections 96 are shown on the front side between the modules 50, 52 and the switch module 54. Although connections between the modules 50, 52, 54 may be made entirely via the backplane 60, FIG. 7 illustrates the addition of very short, high speed signal cables, namely the connections 96. The connections 96 can be a more efficient approach of data transfer than the backplane. In this implementation, the connectors 92 at the rear of the modules 50, 52 can be reduced or eliminated, allowing the surface of the rear thermal contact surface 78 in contact with the outdoor enclosure 30 to be enlarged. This further improves the heat transfer to the outside enclosure 30.

Figure 14:
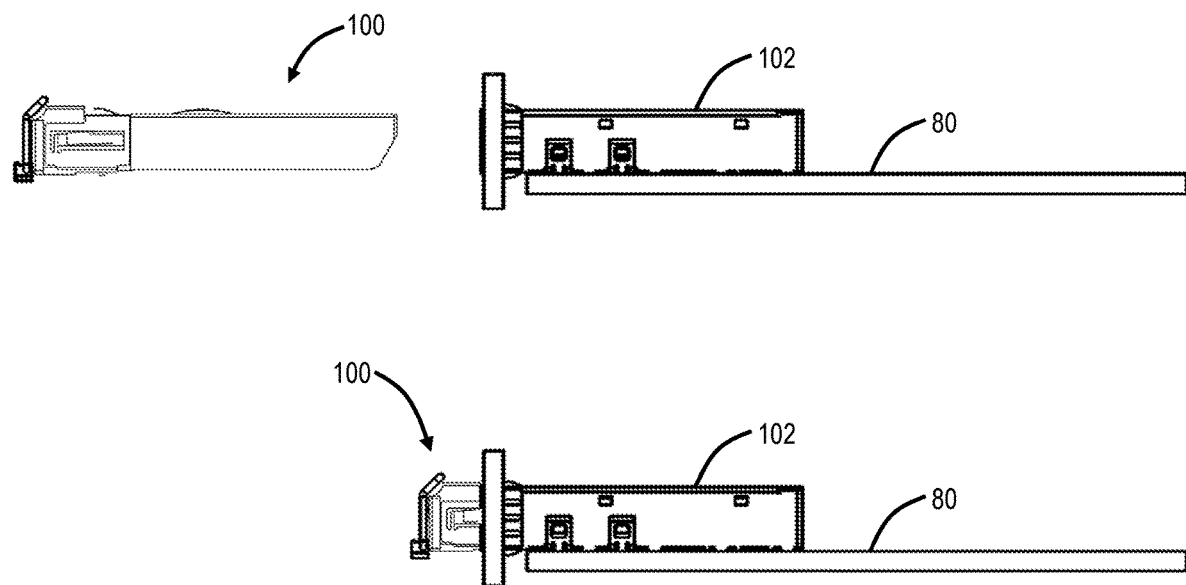
FIG. 14 is a diagram of a pluggable optical module inserted into a cage on a Printed Circuit Board (PCB)

Pluggable Optical Modules and Thermal Management in the Hardened Optical Platform Again, the use of pluggable optical modules 100 is common in controlled environments. As shown in FIG. 14, a pluggable optical module 100 is inserted into a cage 102 mounted on a PCB 80. In the simplest form and in a controlled environment, cooling is provided by ambient air drawn in through a faceplate or the like. There are many advantages of pluggable optical modules 100 including field replaceability, supply chain, cost, application-specific, etc. Thus, pluggable optical modules 100 are widely used in convention optical systems, but they require airflow for cooling.

Figure 15:
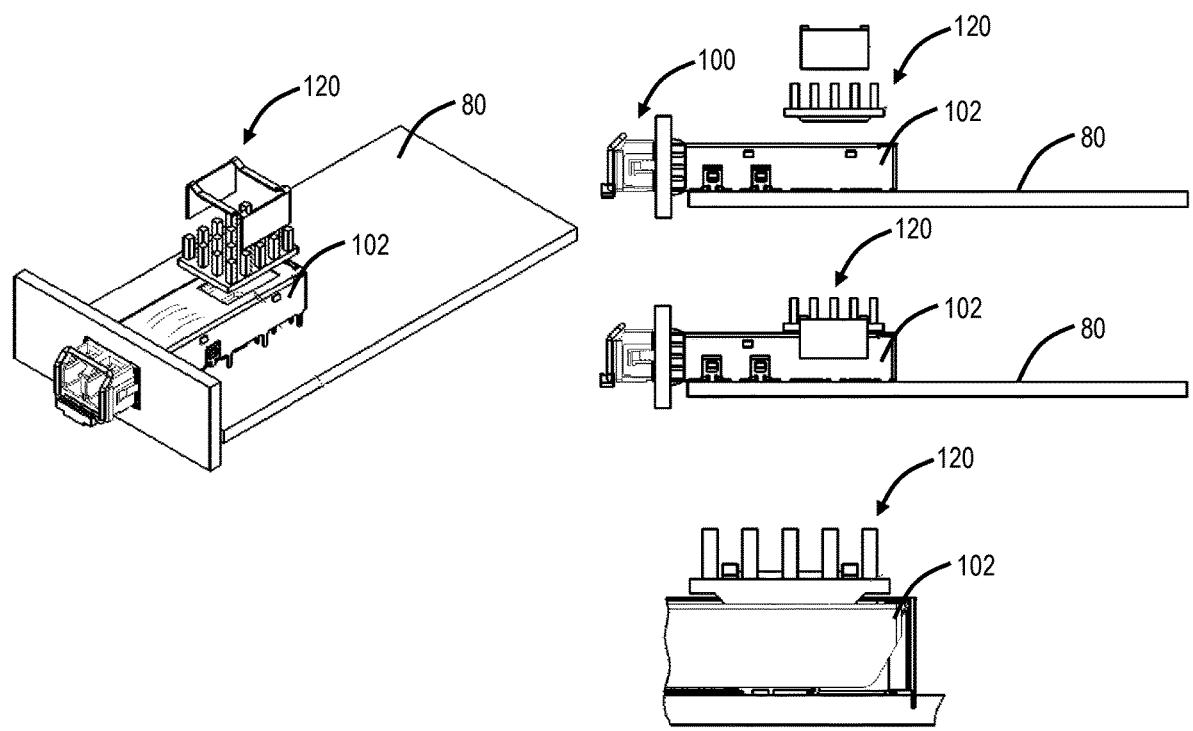
FIG. 15 is a diagram illustrating the addition of a heat sink to the cage housing the pluggable optical module.

In FIG. 15, a heat sink 120 is added, which makes thermal contact directly with the pluggable optical module 100 once inserted in the cage 102 and increases the ability of the system to dissipate heat if airflow is directed at the heat sink 120. Note, the cage 102 includes an one or more openings which expose the pluggable optical module 100 once inserted and the heat sink 120 is configured to make direct contact with the pluggable optical module 100. The contact force and precise alignment needed for the heat sink 120 to function correctly is provided by a spring clip, which mounts directly to the pluggable optic cage 102. These techniques are used in indoor plant forced air systems, i.e., controlled environments, as the heat sink 120 dissipates heat locally in the area around the pluggable optical module 100.

Figure 16:
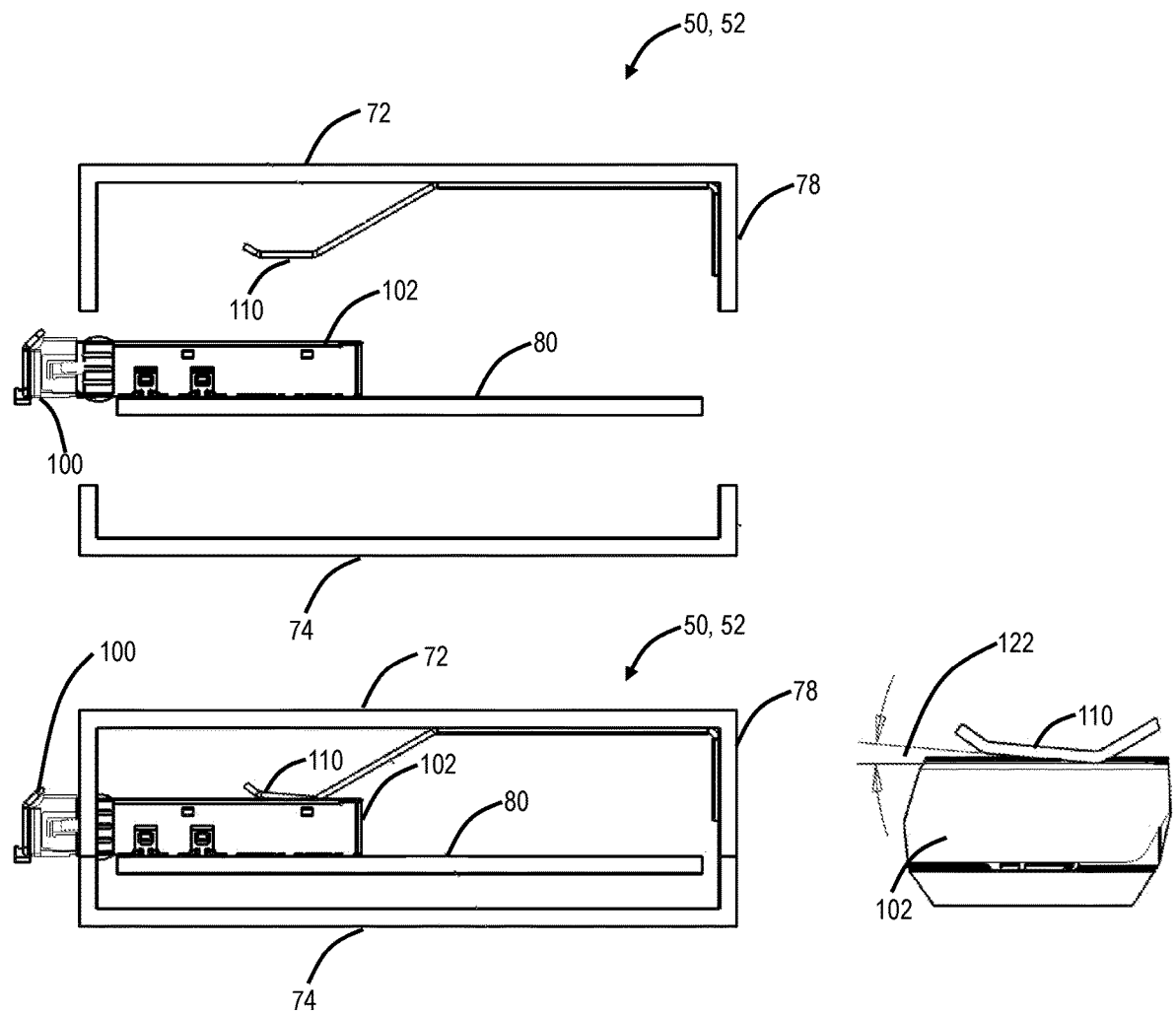
FIG. 16 is a diagram illustrating a heat sink or heat pipe mounted to the first side of the housing of the modules of FIGS. 8 and 9 to transfer heat from the pluggable optical module to the rear thermal contact surface.

As described herein with respect to the hardened optical platform 12, in outdoor plant systems, the PCB 80 carrying the pluggable optical modules 100 is deployed in a multi-part housing 70 to protect the internal components from the environment. Again, the housing 70 covers the PCB 80 and the like thereby preventing airflow. In an embodiment as shown in FIG. 16, a heat sink or heat pipe 110 is mounted to the first side 72 of the housing 70 to transfer heat from the pluggable optical module 100 to the rear thermal contact surface 78. However, the inability to access the top of the module cage 102 after assembly means the typical clips cannot be used. Due to mechanical tolerances, good contact cannot be reliably made with the heat sink or heat pipe 110 in the configuration shown.

Again, numerous techniques for cooling pluggable optical modules 100 exist, but they require the system to be in a forced air flow driven by cooling fans. For outside plant equipment that is deployed in sealed housings 70, there is no forced air flow around the module 50, 52 and heat must be conducted to the housing 70 by means of a heat sink, heat pipe, or vapor chamber. As shown in FIG. 16, attachment and alignment of a heat sink 110 or similar device is made difficult by the lack of access to the pluggable optic cage 102.

In FIG. 16, a spring-loaded heat sink 110 may be affixed to the top of the housing 70, but the deformation needed to create the contact force can cause the interface surface to rotate in a manner that prevents good thermal contact. To reduce thermal resistance, the heat sink 110 must contact the pluggable optical module 100 over as large an area as possible, but if the heat sink 110 rotates, the contact region is reduced to a thin line (reference numeral 122 in FIG. 16). This also increases thermal issues due to heat spreading in the device.

Additionally, the housing 70 eliminates the option of cooling these pluggable optical modules 100 by drawing cooler external air over the device, as is typically done for indoor plant systems.

For outside plant or sealed enclosure (hardened) applications, standard approaches of heat sinking pluggable optical modules 100 cannot be used. The hardened optical platform 12 includes a technique of attaching the heat sink 110 into the housing 70 around the PCB 80 that carries the pluggable optical modules 100, while still providing a mechanism to provide the contact force and precise alignment necessary for good heat transfer.

Figure 17:
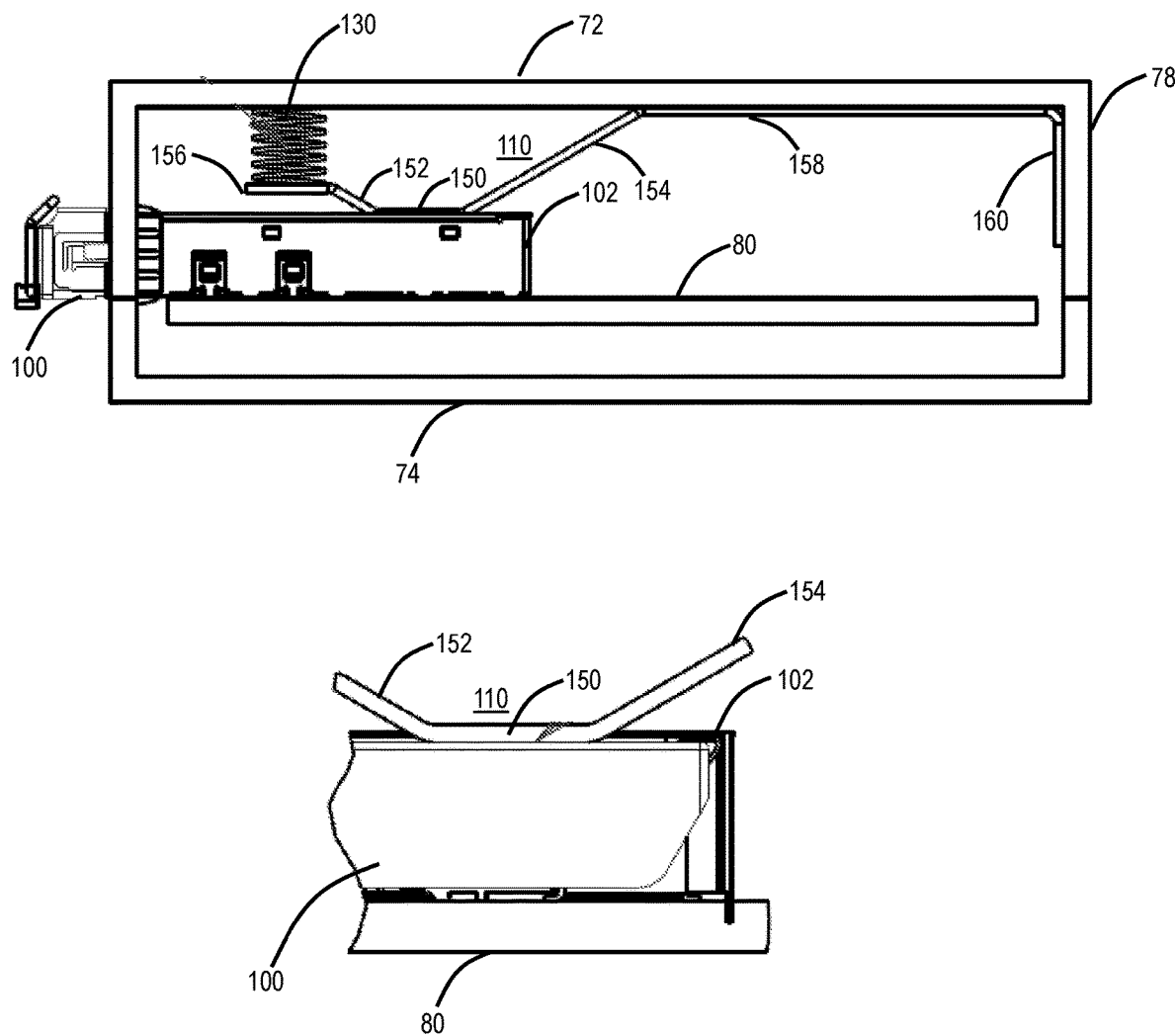
FIG. 17 is a diagram illustrating a heat sink or heat pipe mounted to the first side of the housing of the modules of FIGS. 8 and 9 to transfer heat from the pluggable optical module to the rear thermal contact surface, with a spring ensuring uniform connectivity.
Figure 18:
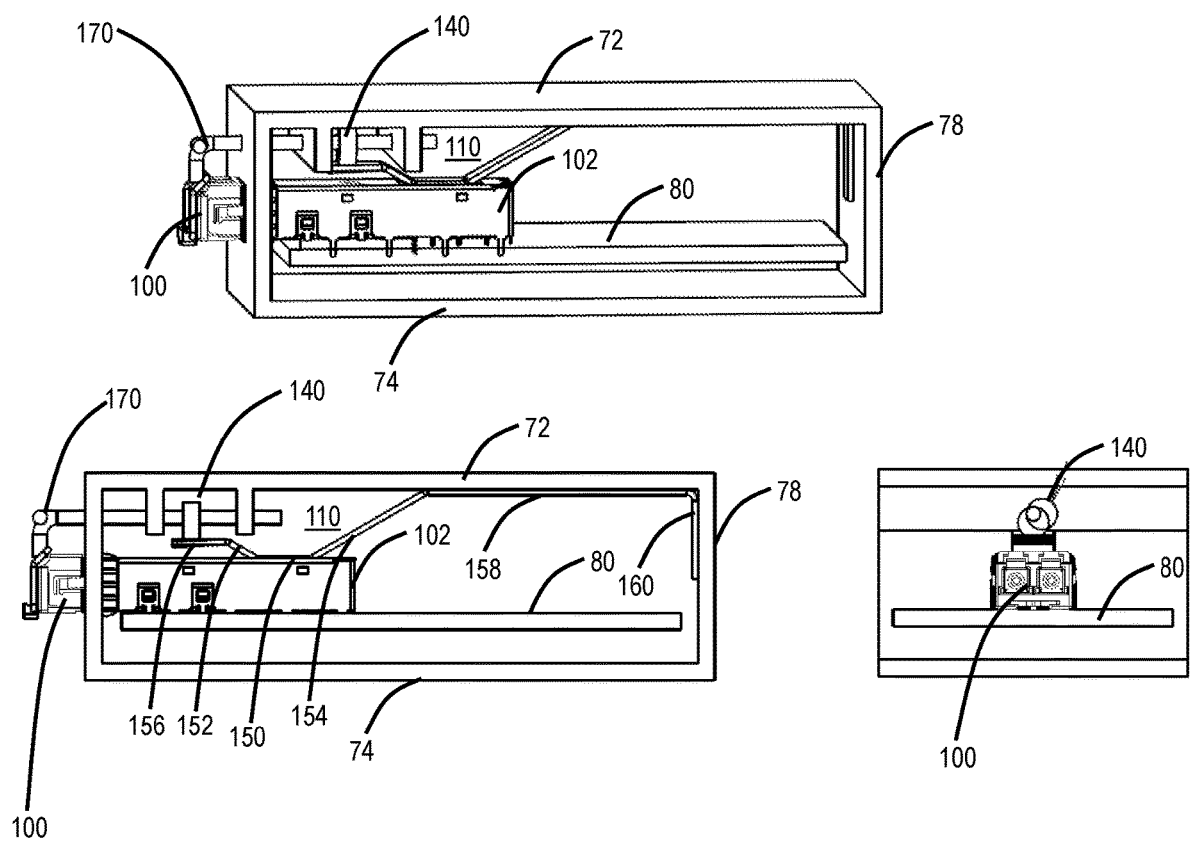
FIG. 18 is a diagram illustrating a heat sink or heat pipe mounted to the first side of the housing of the modules of FIGS. 8 and 9 to transfer heat from the pluggable optical module 100 to the rear thermal contact surface, with a cam ensuring uniform connectivity.

FIG. 17 is a diagram illustrating a heat sink 110 or heat pipe mounted to the first side 72 of the housing 70 of the modules 50, 52 to transfer heat from the pluggable optical module 100 to the rear thermal contact surface 78, with a spring 130 ensuring uniform connectivity. FIG. 18 is a diagram illustrating a heat sink 110 or heat pipe mounted to the first side 72 of the housing 70 of the modules 50, 52 to transfer heat from the pluggable optical module 100 to the rear thermal contact surface 78, with a cam 140 ensuring uniform connectivity.

The heat sink 110 may be a uniform piece of thermally conductive material, such as copper or aluminum. The heat sink 110 includes a first substantially flat portion 150 which makes thermal contact with the pluggable optical module 100. The geometry of the remaining portion of the heat sink is such that it is routed to the inner surface of the clam shell (housing 70) at the rear thermal contact surface 78, where it makes good thermal contact with the portions of the clam shell that are in close proximity to the outside environment. In an embodiment, the thermally conductive conduit includes thermally conductive material such as copper or aluminum including a first substantially flat portion 150 which makes contact with the pluggable optical module 100, a second portion 152, 156 connected to the first substantially flat portion 150 at a first end, and a third portion 154, 158, 160 connected to the first substantially flat portion 150 at a second end opposite from the first end. The third portion extends and attaches to the housing 70. A spring 130 can apply a force to the second portion to ensure uniform contact between the first substantially flat portion 150 and the pluggable optical module 100. A cam 140 can apply a force to the second portion to ensure uniform contact between the first substantially flat portion 150 and the pluggable optical module 100.

In another embodiment, the thermally conductive conduit includes thermally conductive material such as copper or aluminum including a first substantially flat portion 150 which makes contact with the pluggable optical module 100, a second portion 152, 156 connected to the first substantially flat portion 150 at a first end, and a third portion 154, 158, 160 connected to the first substantially flat portion 150 at a second end opposite from the first end. The third portion extends and moves heat to the housing. A spring 130 can apply a force to the second portion to ensure uniform contact between the first substantially flat portion 150 and the pluggable optical module 100. A cam 140 can apply a force to the second portion to ensure uniform contact between the first substantially flat portion 150 and the pluggable optical module 100.

In another embodiment, the heat sink 110 further includes a first diagonal portion 152, a second diagonal portion 154, a second substantially flat portion 156, a third substantially flat portion 158, and a substantially vertical portion 160. The first diagonal portion 152 is connected to the first substantially flat portion 150 and to the second substantially flat portion 156. The second substantially flat portion 156 is configured to contact the spring 130 or the cam 140 to apply a force to ensure the first substantially flat portion 150 makes substantially uniform contact with the pluggable optical module 100.

The second diagonal portion 154 is connected to the first substantially flat portion 150 and to the third substantially flat portion 158. The third substantially flat portion 158 can be disposed to the first side 72 of the housing 70 and is connected to the substantially vertical portion 160. The substantially vertical portion 160 is disposed to the rear thermal contact surface 78 of the housing 70. In this manner, heat generated by the pluggable optical module 100 is conducted from the first substantially flat portion 150 to the second diagonal portion 154 to the third substantially flat portion 158 and to the substantially vertical portion 160 which in turn conducts the heat to the rear thermal contact surface 78 for dissipation into the environment. Also, heat can further be conducted from the first diagonal portion 152 to the second substantially flat portion 156 to the spring 130 or the cam 140.

Note, the first diagonal portion 152 and the second diagonal portion 154 could be joined with the adjacent portions. Also, the first diagonal portion 152 and the second diagonal portion 154 could be straight diagonal, curved or other shaped sections to optimize the contact forces and motion of the first substantially flat portion 150 while maintaining a low thermal resistance path.

For higher power applications, a high-conductivity composite, heat pipe or vapor chamber may be used instead of the heat sink 110, with a similar structure to the rear thermal contact surface 78. The heat sink 110 or the heat pipe, etc. is affixed to the first side 72 of the housing 70 before assembly. That is, the thermally conductive conduit can be the heat sink 110, a heat pipe, a vapor chamber, etc.

The heat sink 110 is designed such that it is displaced by the pluggable optical module 100 when the pluggable optical module 100 is plugged into the cage 102. Normally, the heat sink 110 would also rotate as it is displaced (as shown in FIG. 16), creating a poor thermal contact. The spring 130 (FIG. 17) or rotating cam 140 (FIG. 18) is placed on the opposite of the contact point to balance the force and ensure the full contact area is used, i.e., on the second substantially flat portion 156.

Again, several standard techniques exist for attaching heat sinks 110 and similar devices to pluggable optical modules 100 once inserted, but they cannot be used if the modules must be enclosed in a housing 70, as is typical in outside plant applications. In these applications, a conductive conduit is created for heat to flow from the module 100 to the housing 70 and the outside of the enclosure 30. In addition, this conduit of the heat sink 110 is created without removing the ability to install and remove the pluggable optical modules 100 from the system and without putting excessive or uncontrolled force on the module 100.

As shown in FIGS. 17 and 18, the proposed solution accomplishes this by attaching a heat sink 110 or heat pipe to the housing 70 and using advantageous placement of springs 130 or cams 140 to align the heat sink 110 with the pluggable optical module 100. Again, the heat sink 110 or another device for the thermally conductive conduit directly contacts the pluggable optical module 100 through openings in the cage 102, once the pluggable optical module 100 is inserted.

This solution allows for good alignment between the heat sink 110 and the pluggable optical module 100 by placing the spring 130 or other elastic material on the other side of the contact region from where the heat sink 110 is routed to the housing. This spring 130 or elastic material may also be selected to have advantageous thermal properties.

The balancing force created by the spring 130 ensures a flat contact between the heat sink 110 and the pluggable optical module 100 via the first substantially flat portion 150. Contact force can be controlled simply by adjusting the geometry of the heat sink 110 (namely, the material and/or angles of the diagonal portions) and selecting the appropriate spring 130 tension. Furthermore, the spring force may be created by using a compliant material that is selected for its advantageous thermal properties.

A second approach of ensuring contact between the heat sink 110 and the pluggable optical module 100 is shown in FIG. 18. In this case, the spring 130 is replaced with a rotating cam 140, which makes contact to the heat sink 110 when rotated and provides the necessary force. An actuating handle 170 of the cam 140 can be shaped such that the pluggable optical module 100 cannot be removed until the cam 140 is disengaged. Rotation of the actuating handle 170 causes the cam 140 to apply a force to the second substantially flat portion 156, providing similar functionality as the spring 130. In either case, the contact force can be precisely controlled by the mechanical design of the spring or cam system.

Figure 19:
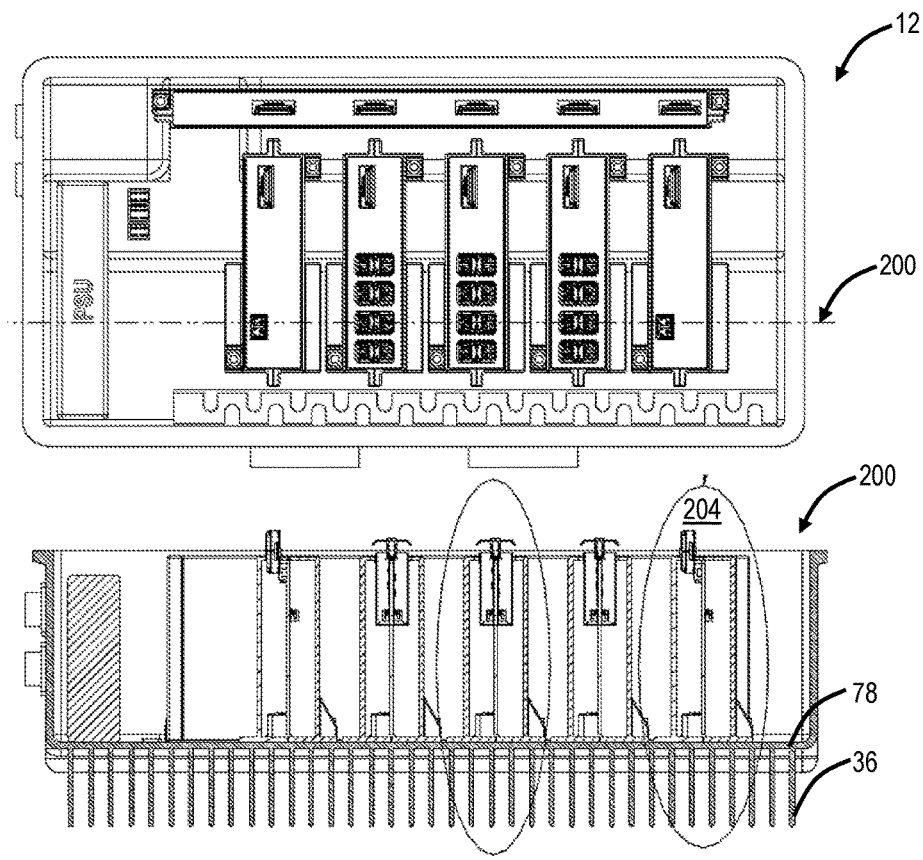
FIG. 19 is a diagram illustrating the hardened optical platform including the modules with the thermal management techniques for the pluggable optical modules described in FIGS. 17 and 18.
Figure 19:
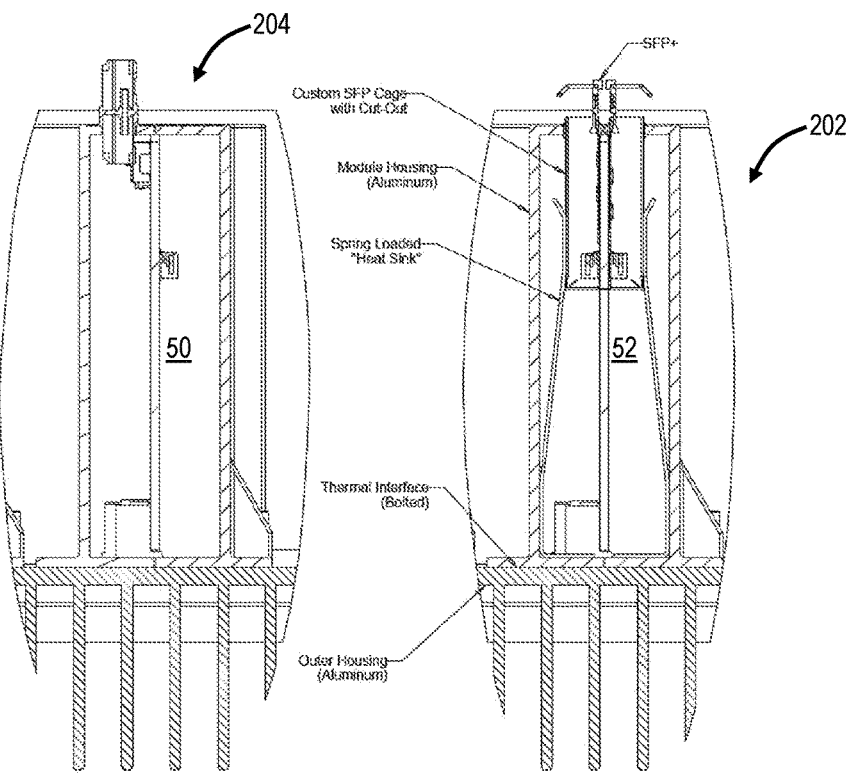

FIG. 19 is a diagram illustrating the hardened optical platform 12 including the modules 50, 52 with the thermal management techniques for the pluggable optical modules 100 described in FIGS. 17 and 18. Specifically, a cross-section 200 is shown of the hardened optical platform 12, and additional details 202, 204 are illustrated for a client module 52 and a line module 50, respectively. In this example, the client module 52 is shown with an SFP+ pluggable optical module 100 and the heat sink 110 is shown providing a conductive heat path from the SFP+pluggable optical module 100 to the rear thermal contact surface 78 of the housing 70. The rear thermal contact surface 78 has thermal connectivity to the enclosure 30, specifically to the heat fins 36 on the rear portion of the enclosure 30. Again, using the techniques in FIGS. 17 and 18, the pluggable optical module 100 is supported in the hardened optical platform 12 without cooling fans or forced airflow.

Module in a Hardened Optical Platform

In an embodiment, a module 50, 52 in a hardened optical platform 12 includes one or more Printed Circuit Boards (PCB) and associated components; at least one cage 102 configured to receive a pluggable optical module 100, wherein the at least one cage 102 is on a PCB 80 of the one or more PCBs; and a housing 70 enclosing the one or more PCBs, wherein the housing 70 covers the one or more PCBs, the associated components, and the at least one cage 102 with the pluggable optical module 100, with respect to airflow, wherein a thermally conductive conduit 110 is formed between the pluggable optical module 100 and the housing 70, enabling the pluggable optical module 100 to operate in the housing 70 which is sealed with respect to airflow.

The thermally conductive conduit 110 can be a heat sink which is configured to make uniform thermal contact with the pluggable optical module 100 once inserted. The thermally conductive conduit is formed by a thermally conductive material such as copper or aluminum which is routed from the cage 102 to the housing 70. Heat moves along the thermally conductive path to the housing 70 and from the housing 70 to a thermal contact surface on an enclosure 30 of the hardened optical platform 12.

The thermally conductive conduit can include thermally conductive material such as copper or aluminum including a first substantially flat portion 150 which makes contact with the pluggable optical module 100, a first diagonal portion 152, a second diagonal portion 154, a second substantially flat portion 156, a third substantially flat portion 158, and a substantially vertical portion 160. The first diagonal portion 152 and the second diagonal portion 154 are each disposed to the first substantially flat portion 150, the second substantially flat portion 156 is disposed to the first diagonal portion 152, the third substantially flat portion 158 is disposed to the second diagonal portion 154, and the substantially vertical portion 160 is disposed to the third substantially flat portion 160.

A spring 130 can apply a force to the second substantially flat portion 150 to ensure uniform contact between the first substantially flat portion 150 and the pluggable optical module 100. A cam 140 can apply a force to the second substantially flat portion 156 to ensure uniform contact between the first substantially flat portion 150 and the pluggable optical module 100. The pluggable optical module 100 can be locked in place when the cam 140 is engaged.

In another embodiment, a method includes providing a module configured to operate in a hardened optical platform, wherein the module includes one or more Printed Circuit Boards (PCB) and associated components; at least one cage configured to receive a pluggable optical module, wherein the at least one cage is on a PCB of the one or more PCBs; and a housing enclosing the one or more PCBs, wherein the housing covers the one or more PCBs, the associated components, and the at least one cage with the pluggable optical module, with respect to airflow, wherein a thermally conductive conduit is formed between the pluggable optical module once inserted and the housing, enabling the pluggable optical module to operate in the housing which is sealed with respect to airflow.

Hardened Optical Platform

In another embodiment, a hardened optical platform 12 includes a plurality of modules 50, 52, 54, 56 housed in a hardened enclosure 30 which is environmentally sealed; a first module 50, 52 of the plurality of modules 50, 52, 54, 56 including one or more Printed Circuit Boards (PCB) and associated components; at least one cage 102 configured to receive a pluggable optical module 100, wherein the at least one cage 102 is on a PCB 80 of the one or more PCBs; and a housing 70 enclosing the one or more PCBs, wherein the housing 70 covers the one or more PCBs, the associated components, and the at least one cage 102 with the pluggable optical module 100, with respect to airflow, wherein a thermally conductive conduit is formed between the pluggable optical module 100 once inserted and the housing 70 and from the housing 70 to the hardened enclosure 30, enabling the pluggable optical module 100 to operate in the hardened enclosure 30 which is sealed with respect to airflow. The plurality of modules can include a line module 50, a client module 52, and a switch module 54.

Signal Connectivity

Figure 20:
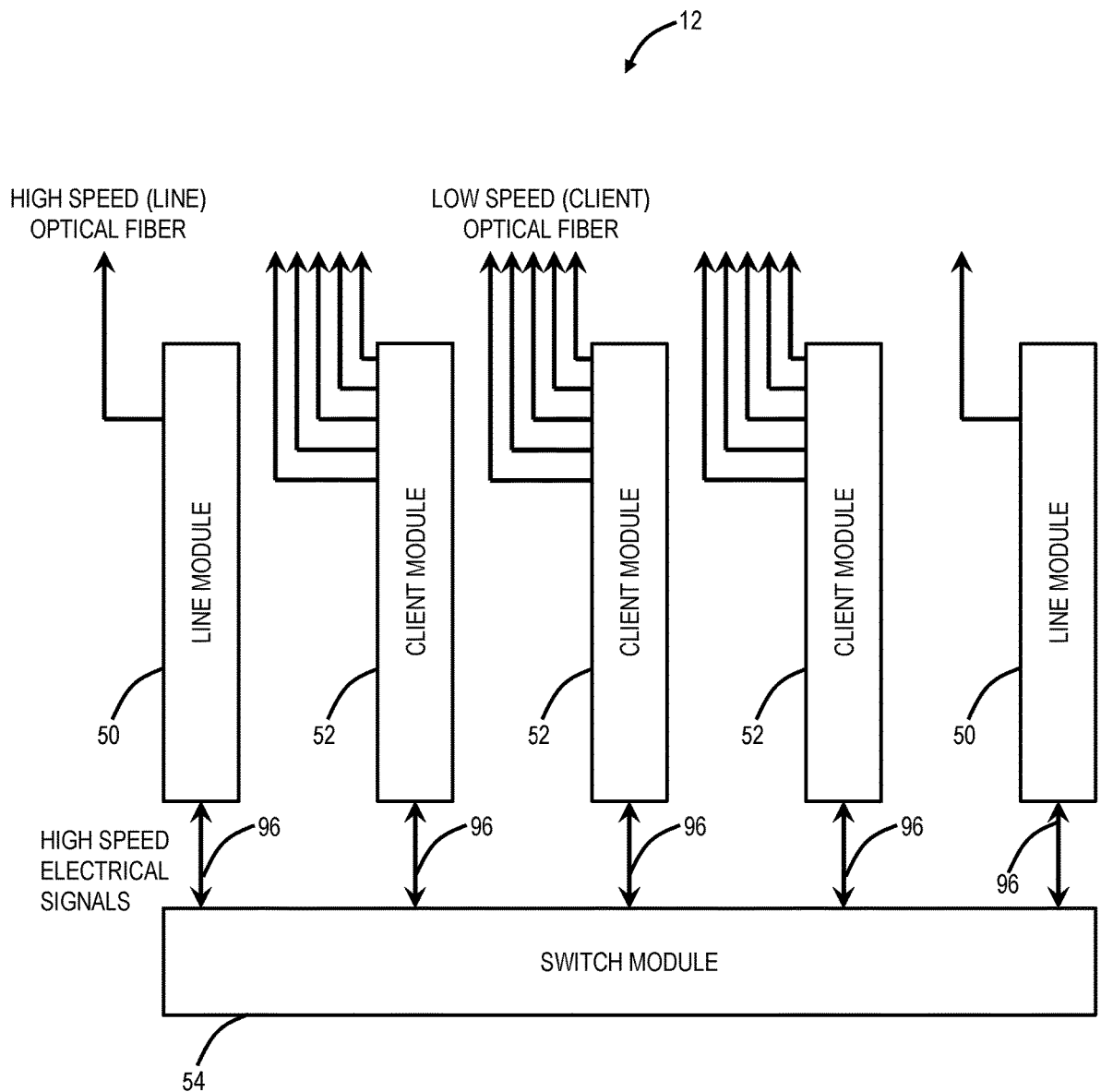
FIG. 20 is a block diagram of the hardened optical platform illustrating signal connectivity between the modules and the switch module via high-speed cabling connections eliminating the backplane.
Figure 21:
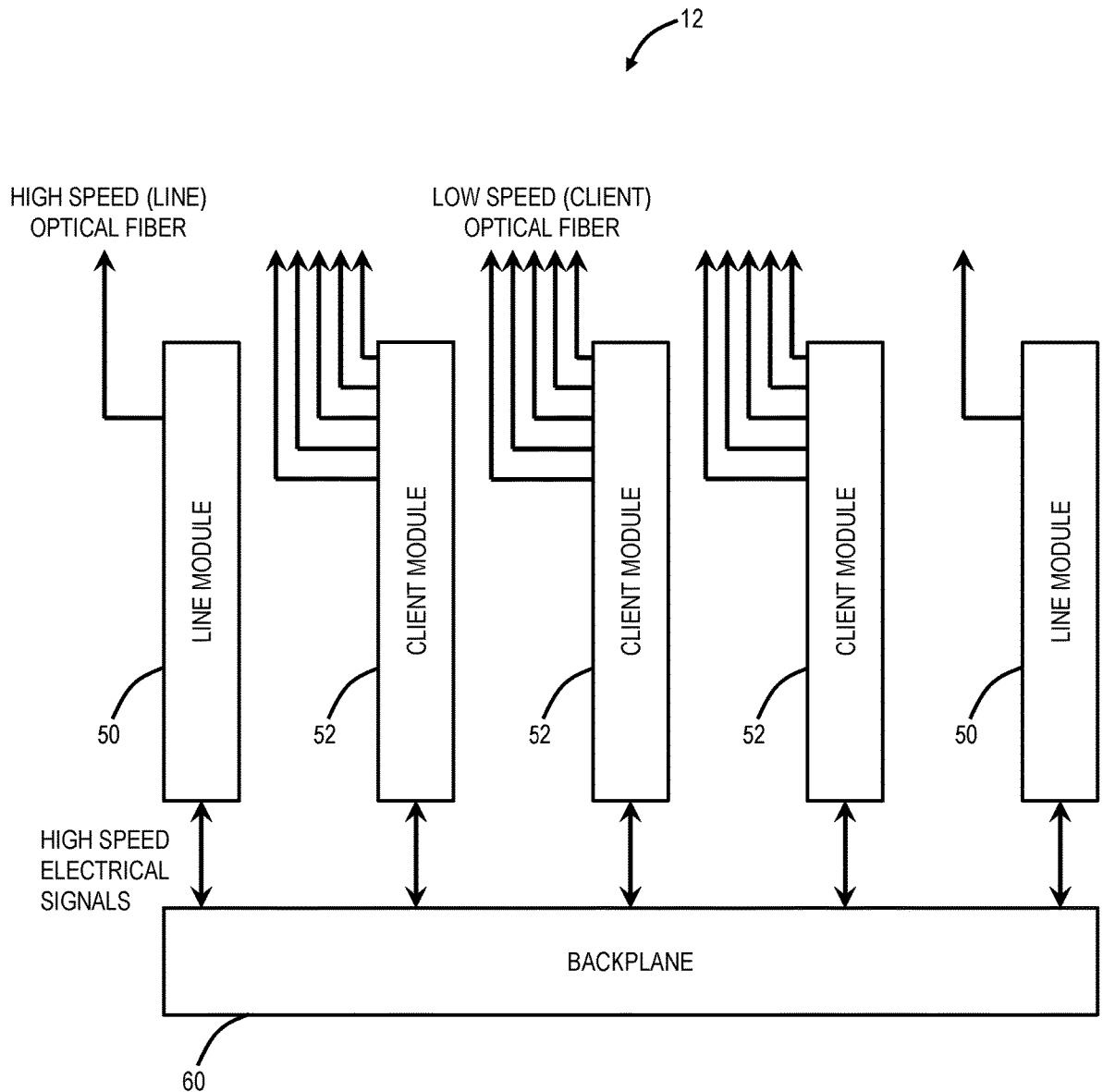
FIG. 21 is a block diagram of the hardened optical platform illustrating signal connectivity between the modules and the switch module via the backplane.
Figure 22:
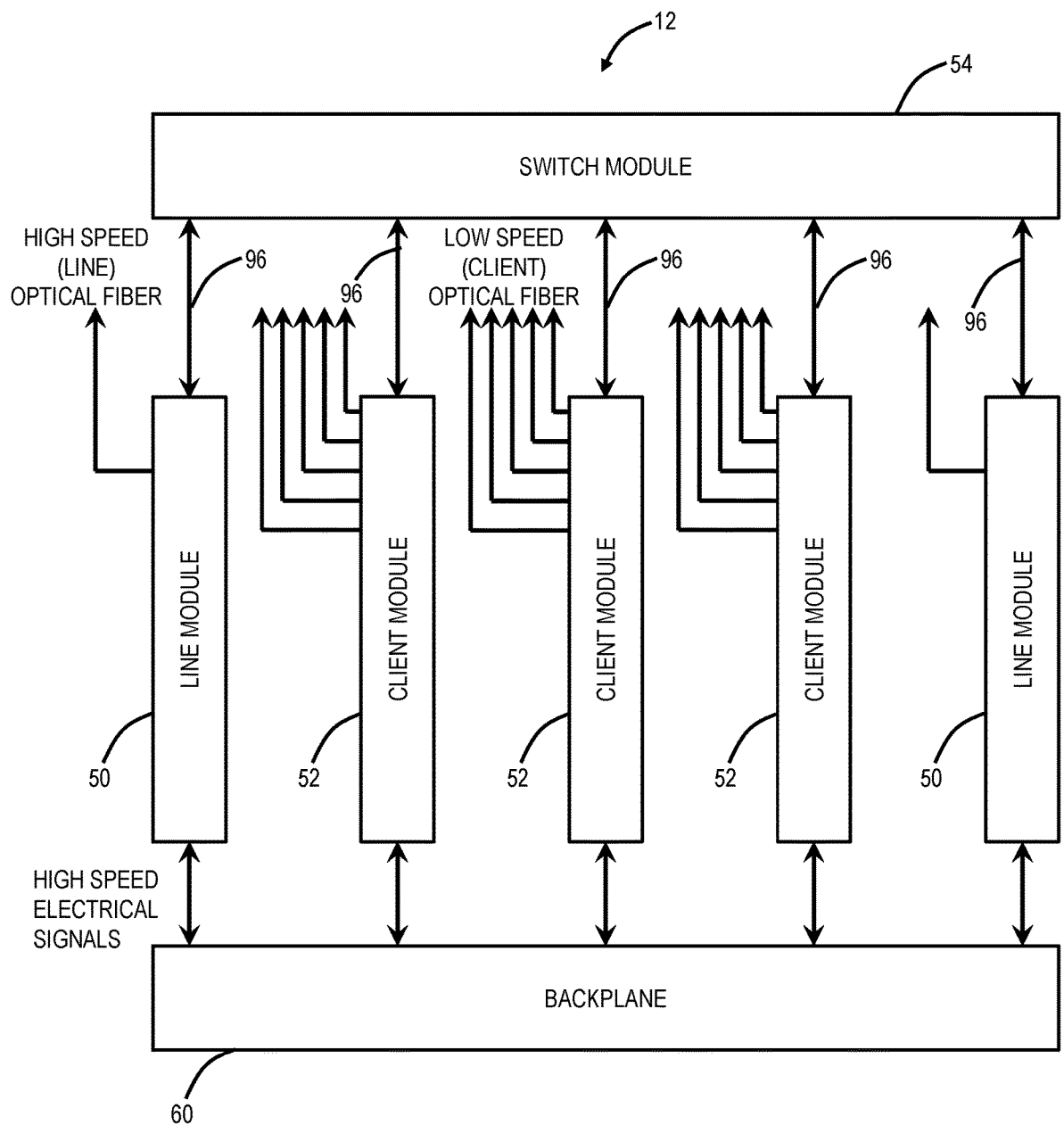
FIG. 22 is a block diagram of the hardened optical platform illustrating signal connectivity between the modules and the switch module via a combination of the high-speed cabling connections and the backplane.

FIG. 20 is a block diagram of the hardened optical platform 12 illustrating signal connectivity between the modules 50, 52 and the switch module 54 via high-speed cabling connections 96, eliminating the backplane 60. FIG. 21 is a block diagram of the hardened optical platform 12 illustrating signal connectivity between the modules 50, 52 and the switch module 54 via the backplane 60. FIG. 22 is a block diagram of the hardened optical platform 12 illustrating signal connectivity between the modules 50, 52 and the switch module 54 via a combination of the high-speed cabling connections 96 and the backplane 60.

Again, the hardened optical platform 12 can be a network element supporting modular packet and Optical Transport Networking (OTN) switching in the network 10. For example, the hardened optical platform 12 can support 24×10G client ports (facing the HFC, for example) and 2×100G/200G line ports (facing the optical access network 18). The 24×10G client ports can be formed by the client modules 52 and the 2×100G/200G line ports can be formed by the line modules 50. The switch module 54 can provide OTN and/or packet switching between the client modules 52 and the line modules 54. Also, the switch module 54 can further operate as a network element controller, for Operations, Administration, Maintenance, and Provisioning (OAM&P) functionality including communication to a Network Management System (NMS), Element Management System (EMS), Software Defined Networking (SDN) controller, control plane, etc.

Again, the hardened optical platform 12 is a passively cooled device with the enclosure 30 and the door 32 being weatherproof and thus having no airflow internally from the surrounding environment. Accordingly, the arrangement of the switch module 54 perpendicular to the line modules 50 and the client modules 52, including the use of the high-speed cable connections 96 provides improved thermal performance and network element modularity.

In an embodiment, the high-speed cable connections 96 can be twinaxial cables or the like. With the arrangement using the high-speed cable connections 96, the connection distance is minimized, which can eliminate the need for re-timers and reduces insertion loss—both of which reduce power consumption and improve thermal performance in the modules 50, 52, 54. The high-speed cable connections 96 allow (but do not require) the backplane 60 to be eliminated from the design as shown in FIG. 20, which further improves thermal performance, since the backplane 60 is a thermal insulator that prevents the modules 50, 52, 54 from moving their heat from the rear thermal contact surface 78 to the heat fins 36 on the rear portion of the enclosure 30.

The high-speed cable connections 96 are selectively configured on the faceplate of the modules 50, 52, 54 enabling rolling upgrade of connectivity to add more links, upgrade to faster cable technology, or add mate-to-mate links without bringing down all of the modules 50, 52, 54. The perpendicular arrangement also allows high power components within the enclosure 30 to be widely separated (e.g., separating the two modem line modules 50 on both ends of the enclosure 30), thereby reducing hotspots and facilitating heat transfer to the outside environment.

The standard practice would have the PSUs 56 distribute power directly to each module 50, 52, 54, but the switch module 54 can also act as a power distribution module. By incorporating the power distribution functionality into the switch module 54, it advantageously reduces the total number of cable bundles that have to be managed in an outdoor environment (perhaps while up on a cherry picker when the hardened optical platform 12 is deployed on a pole). This enables a power distribution backplane to be eliminated from the design entirely, which improves thermal performance.

In an embodiment, the hardened optical platform 12 can use a non-traditional application of Universal Serial Bus (USB) as management connectivity between the modules 50, 52, 54. USB allows the virtualization of presence, ID, General Purpose Input/Output (GPIO), software download, configuration, Inter-Integrated Circuit (I2C), Management Data Input/Output (MDIO), Peripheral Component Interconnect Express (PCIe), power delivery, etc. USB also allows alternate modes such as Ethernet and PCI to be negotiated for a subset of the USB pins. USB reduces the "one pin for every signal" approach and replaces it with a "one pin for many signals" approach that reduces interconnect which contributes to more physically manageable modularity.

In another embodiment, the hardened optical platform 12 can include an internal device that responds to an ambient temperature sensor and the lid being opened to trigger heating of one or more devices. A small strand-mounted device could be running at 15 C internally and go down to −30 C very quickly when the lid is opened and cold air rushes in. This can affect temperature-sensitive optics or oscillators that would benefit from a slow ramp. Note, power can come in through several thousand feet of coax and there's a 1% decrease in resistance for every 3 C temperature decrease. At cold temperatures, there can be an extra few watts available for heating that would be dissipated in the cable in the summer.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A module in a hardened optical platform comprising:
one or more Printed Circuit Boards (PCB) and associated components;
at least one cage configured to receive a pluggable optical module, wherein the at least one cage on a PCB of the one or more PCBs;
a housing enclosing the one or more PCBs, wherein the housing covers the one or more PCBs, the associated components, and the at least one cage with the pluggable optical module, with respect to airflow; and
a heat sink adapted to form a thermally conductive conduit between the pluggable optical module, once inserted, and the housing, enabling the pluggable optical module to operate in the housing which is sealed with respect to airflow, the heat sink comprising a first portion adapted to thermally contact the pluggable optical module, once inserted, a second portion adapted to transfer a biasing force to the first portion and bias the first portion towards the pluggable optical module, once inserted, and a third portion is attached to and in thermal contact with the housing, wherein the first portion is positioned between the second portion and the third portion.

2. The module in a hardened optical platform of claim 1, wherein the heat sink which is configured to make uniform thermal contact with the pluggable optical module, once inserted, and the heat sink extends to and thermally contacts multiple surfaces of the housing.

3. The module in a hardened optical platform of claim 1, wherein the thermally conductive conduit is formed by copper or aluminum which is routed from the cage to the housing.

4. The module in a hardened optical platform of claim 3, wherein heat moves along the thermally conductive conduit to the housing and from the housing to a thermal contact surface on an enclosure of the hardened optical platform.

5. The module in a hardened optical platform of claim 1, wherein the second portion is connected to a first end of the first portion and the third portion is connected to a second end of the first portion, the second end being opposite from the first end.

6. The module in a hardened optical platform of claim 5, wherein the first portion is substantially flat and the third portion includes at least one substantially flat section in thermal contact with the housing.

7. The module in a hardened optical platform of claim 5, wherein a spring applies the biasing force to the second portion to ensure uniform contact between the first portion and the pluggable optical module, once inserted.

8. The module in a hardened optical platform of claim 5, wherein a cam applies the biasing force to the second portion to ensure uniform contact between the first portion and the pluggable optical module, once inserted.

9. The module in a hardened optical platform of claim 8, wherein the cam is adapted to rotate to engage the biasing force, and wherein a handle adapted for rotating the cam is adapted to prevent removal of the pluggable optical module from the housing while the biasing force is engaged.

10. A hardened optical platform comprising:
a plurality of modules housed in a hardened enclosure which is environmentally sealed;
a first module of the plurality of modules including:
one or more Printed Circuit Boards (PCB) and associated components;
at least one cage configured to receive a pluggable optical module, wherein the at least one cage is on a PCB of the one or more PCBs;
a housing enclosing the one or more PCBs, wherein the housing covers the one or more PCBs, the associated components, and the at least one cage with the pluggable optical module, with respect to airflow; and
a heat sink adapted to form a thermally conductive conduit between the pluggable optical module, once inserted, and the housing and from the housing to the hardened enclosure, enabling the pluggable optical module to operate in the hardened enclosure which is sealed with respect to airflow, the heat sink comprising a first portion adapted to thermally contact the pluggable optical module, once inserted, a second portion adapted to transfer a biasing force to the first portion and bias the first portion towards the pluggable optical module, once inserted, and a third portion is attached to and in thermal contact with the housing, wherein the first portion is positioned between the second portion and the third portion.

11. The hardened optical platform of claim 10, wherein the heat sink which is configured to make uniform thermal contact with the pluggable optical module once inserted and the heat sink extends to and thermally contacts multiple surfaces of the housing.

12. The hardened optical platform of claim 10, wherein the thermally conductive conduit is formed by copper or aluminum which is routed from the cage to the housing to the hardened enclosure.

13. The hardened optical platform of claim 12, wherein heat moves along the thermally conductive conduit to the housing and from the housing to a thermal contact surface on an enclosure of the hardened optical platform.

14. The hardened optical platform of claim 10, wherein the second portion is connected to a first end of the first portion and the third portion is connected to a the second end of the first portion, the second end being opposite from the first end.

15. The hardened optical platform of claim 14, wherein the first portion is substantially flat and the third portion includes at least one substantially flat section in thermal contact with the housing.

16. The hardened optical platform of claim 14, wherein a spring or cam applies the biasing force to the second portion to ensure uniform contact between the first portion and the pluggable optical module, once inserted.

17. The hardened optical platform of claim 10, wherein the plurality of modules include a line module, a client module, and a switch module.

18. The hardened optical platform of claim 10, wherein the hardened enclosure includes a plurality of heat fins which are thermally disposed to the thermally conductive path for radiating heat external to the hardened enclosure.

19. A method comprising:
providing a module configured to operate in a hardened optical platform, wherein the module includes:
one or more Printed Circuit Boards (PCB) and associated components;
at least one cage configured to receive a pluggable optical module, wherein the at least one cage is on a PCB of the one or more PCBs;

a housing enclosing the one or more PCBs, wherein the housing covers the one or more PCBs, the associated components, and the at least one cage with the pluggable optical module, with respect to airflow, and a heat sink adapted to form a thermally conductive conduit between the pluggable optical module, once inserted, and the housing, enabling the pluggable optical module to operate in the housing which is sealed with respect to airflow, the heat sink comprising a first portion adapted to thermally contact the pluggable optical module, once inserted, a second portion dapted to transfer a biasing force to the first portion and bias to first portion towards the pluggable optical module, once inserted, and a third portion is attached to and in thermal contact with the housing, wherein the first portion is positioned between the second portion and the third portion.

20. The method of claim 19, further comprising:

engaging one of a spring and a cam to apply the biasing force and cause the thermally conductive conduit to make uniform contact with the pluggable optical module, once inserted.

\* \* \* \* \*